(12) United States Patent
Yamazaki

(10) Patent No.: US 8,785,258 B2
(45) Date of Patent: Jul. 22, 2014

(54) METHOD FOR MANUFACTURING SEMICONDUCTOR DEVICE

(71) Applicant: Semiconductor Energy Laboratory Co., Ltd., Atsugi (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 35 days.

(21) Appl. No.: 13/711,022

(22) Filed: Dec. 11, 2012

(65) Prior Publication Data
US 2013/0157422 A1    Jun. 20, 2013

(30) Foreign Application Priority Data
Dec. 20, 2011  (JP) ................. 2011-278978

(51) Int. Cl.
H01L 21/00  (2006.01)
H01L 21/84  (2006.01)
H01L 21/44  (2006.01)

(52) U.S. Cl.
USPC ............................ 438/149; 438/688; 257/43

(58) Field of Classification Search
CPC ...................... H01L 29/7869; H01L 29/66742; H01L 27/1225; H01L 27/1156; H01L 27/1207
USPC ...................... 438/149, 688; 257/43
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Michelle Mandala
(74) *Attorney, Agent, or Firm* — Eric J. Robinson; Robinson Intellectual Property Law Office, P.C.

(57) ABSTRACT

A highly reliable semiconductor device which includes a transistor including an oxide semiconductor is provided. In the semiconductor device including a bottom-gate transistor including an oxide semiconductor layer, a stacked layer of an insulating layer and an aluminum film is provided in contact with the oxide semiconductor layer. Oxygen doping treatment is performed in such a manner that oxygen is introduced to the insulating layer and the aluminum film from a position above the aluminum film, whereby a region containing oxygen in excess of the stoichiometric composition is formed in the insulating layer, and the aluminum film is oxidized to form an aluminum oxide film.

16 Claims, 9 Drawing Sheets

(56) References Cited

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0224871 A1 | 9/2010 | Yamaguchi et al. |
| 2012/0001170 A1* | 1/2012 | Yamazaki ................. 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-224479 A | 10/2009 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

(56) References Cited

OTHER PUBLICATIONS

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID DIgest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Sys-

(56) References Cited

OTHER PUBLICATIONS tems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

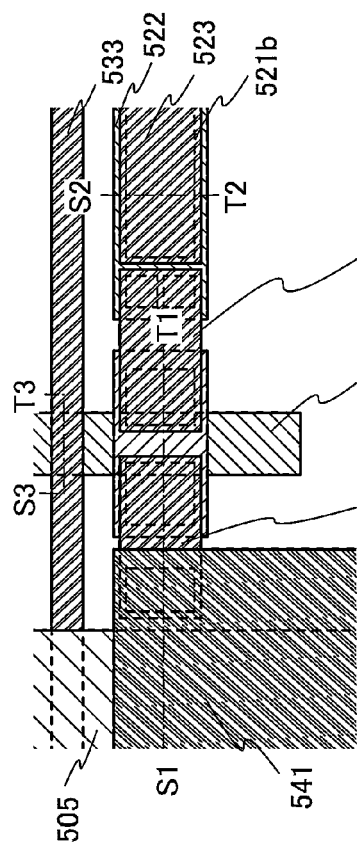
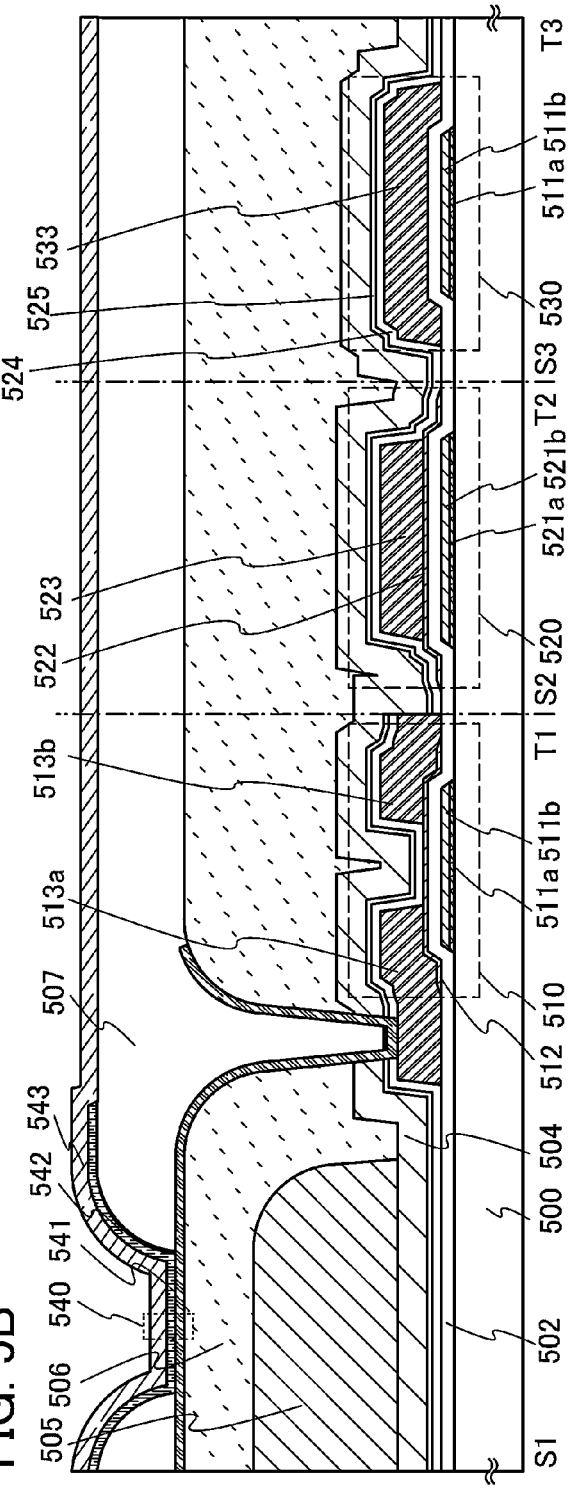
FIG. 5A
FIG. 5B

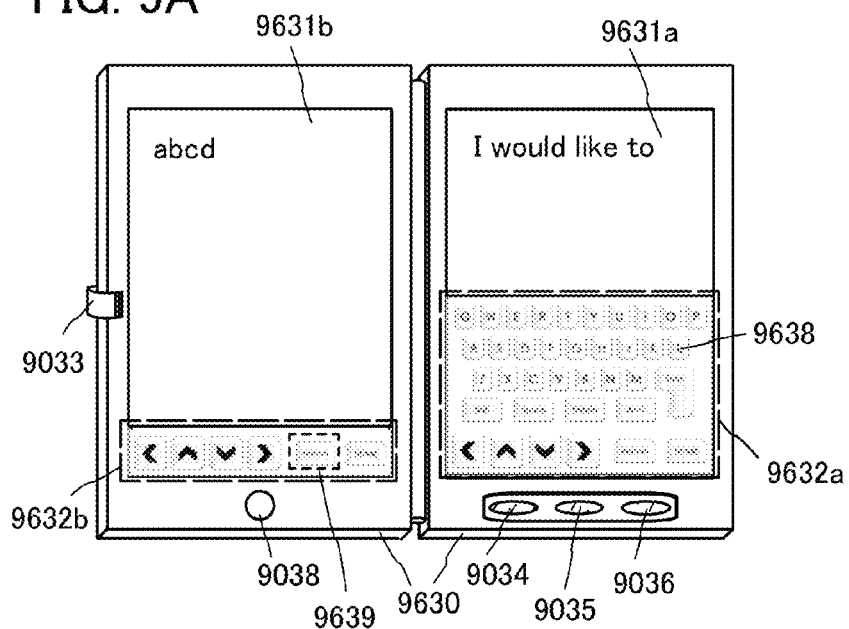
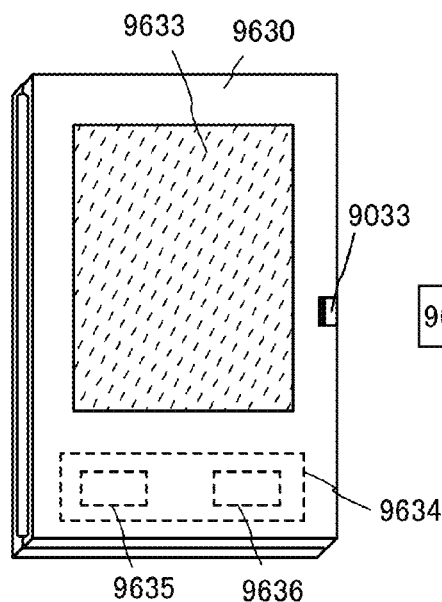
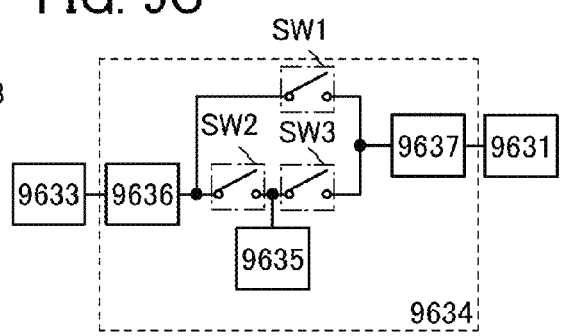

METHOD FOR MANUFACTURING SEMICONDUCTOR DEVICE

BACKGROUND OF THE INVENTION

1. Field of the Invention

The invention disclosed in this specification relates to a semiconductor device and a manufacturing method thereof.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

In recent years, a technique by which transistors are formed using semiconductor thin films formed over a substrate having an insulating surface has been attracting attention. Such transistors are applied to a wide range of semiconductor electronic devices such as an integrated circuit (IC) and an image display device (also simply referred to as display device). A silicon-based semiconductor material is widely known as a material for a semiconductor thin film applicable to a transistor. As another material, an oxide semiconductor has been attracting attention.

For example, a technique in which a transistor is manufactured using a zinc oxide or an In—Ga—Zn-based oxide as an oxide semiconductor is disclosed (see Patent Documents 1 and 2).

Meanwhile, it has been pointed out that hydrogen behaves as a source of carriers in an oxide semiconductor. Therefore, some measures need to be taken to prevent hydrogen from entering the oxide semiconductor at the time of depositing the oxide semiconductor. Further, the following technique is also disclosed: fluctuation of a threshold voltage is suppressed by reducing the amount of hydrogen contained in not only the oxide semiconductor but also a gate insulating film in contact with the oxide semiconductor (see Patent Document 3).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2009-224479

SUMMARY OF THE INVENTION

Moreover, as a carrier supply source other than hydrogen contained in an oxide semiconductor, an oxygen vacancy in the oxide semiconductor can be given. An oxygen vacancy in the oxide semiconductor serves as donor to generate an electron that serves as a carrier in the oxide semiconductor. When many oxygen vacancies exist in an oxide semiconductor including a channel formation region of a transistor, electrons are generated in the channel formation region, which is a cause of shift of the threshold voltage of the transistor in the negative direction.

In view of the aforementioned problem, an object of one embodiment of the present invention is to provide a method for manufacturing a highly reliable semiconductor device including an oxide semiconductor device and having stable electric characteristics.

In a method for manufacturing a semiconductor device which includes a bottom-gate transistor including an oxide semiconductor layer, an insulating layer is formed to be in contact with the oxide semiconductor layer, and an aluminum film is stacked over the insulating layer. Oxygen doping treatment is performed in a manner such that oxygen is introduced into the insulating layer and the aluminum film from a position above the aluminum film. Thus, a region containing oxygen in excess of the stoichiometric composition (hereinafter, referred to as oxygen excess region) is formed in the insulating layer, and the aluminum film is oxidized to form an aluminum oxide film.

When the insulating layer in contact with the oxide semiconductor layer includes an oxygen excess region, oxygen can be supplied to the oxide semiconductor layer. Accordingly, elimination of oxygen from the oxide semiconductor layer can be prevented, and oxygen vacancies in the layer can be filled.

The aluminum oxide film has a high shielding effect (blocking effect) of preventing penetration of both oxygen and impurities such as hydrogen or moisture. Thus, in and after the manufacturing process, the aluminum oxide film functions as a protective film for preventing entry of impurities such as hydrogen or moisture, which cause a change in electric characteristics of a transistor, into the oxide semiconductor layer and release of oxygen, which is a main constituent material of the oxide semiconductor, from the oxide semiconductor layer.

In a method for manufacturing a semiconductor device according to one embodiment of the present invention, an aluminum oxide film stacked over an insulating layer is obtained in such a manner that an aluminum film is formed and then oxidized by oxygen doping treatment. When an aluminum oxide film is formed by oxidization of an aluminum film, productivity can be increased as compared with the case where an aluminum oxide film is deposited by a sputtering method. Further, the aluminum film can be doped with oxygen in the same step as oxygen doping treatment performed on the insulating layer. Therefore, the aluminum oxide film can be formed without an additional step for oxidizing the aluminum film.

It is preferable that the insulating layer in contact with the oxide semiconductor layer contain impurities such as water or hydrogen as little as possible. In the case where hydrogen is contained in the insulating layer in contact with the oxide semiconductor layer, the hydrogen may enter the oxide semiconductor layer or the hydrogen may cause extraction of oxygen in the oxide semiconductor layer. Thus, the insulating layer in contact with the oxide semiconductor layer is preferably a film which is subjected to heat treatment for dehydration or dehydrogenation.

One embodiment of the present invention is a method for manufacturing a semiconductor device including the following steps: forming a gate electrode layer; forming a gate insulating layer over the gate electrode layer; forming an oxide semiconductor layer to overlap with the gate electrode layer with the gate insulating layer interposed therebetween; forming a source electrode layer and a drain electrode layer which are electrically connected to the oxide semiconductor layer; forming an insulating layer which is over the source electrode layer and the drain electrode layer and in contact with the oxide semiconductor layer; forming an aluminum film in contact with the insulating layer; and performing oxygen doping treatment on the aluminum film and the insulating layer, so that oxygen is added to the insulating layer and the aluminum film is oxidized to be an aluminum oxide film.

Another embodiment of the present invention is a method for manufacturing a semiconductor device including the following steps: forming a gate electrode layer; forming a gate insulating layer over the gate electrode layer; forming an oxygen excess region in the gate insulating layer by performing oxygen doping treatment; forming an oxide semiconductor layer to overlap with the gate electrode layer with the gate insulating layer interposed therebetween; forming a source electrode layer and a drain electrode layer which are electrically connected to the oxide semiconductor layer; forming an insulating layer which is over the source electrode layer and the drain electrode layer and in contact with the oxide semiconductor layer; forming an aluminum film in contact with the insulating layer; performing oxygen doping treatment on the aluminum film and the insulating layer, so that oxygen is added to the insulating layer and the aluminum film is oxidized to be an aluminum oxide film.

In the above methods for manufacturing a semiconductor device, heat treatment is preferably performed on the gate insulating layer before the gate insulating layer is subjected to the oxygen doping treatment, so that water or hydrogen contained in the gate insulating layer is reduced. As the gate insulating layer, an insulating layer containing nitrogen is preferably used.

Further, in any of the above methods for manufacturing a semiconductor device, heat treatment is preferably performed on the insulating layer before the aluminum film is formed, so that water or hydrogen contained in the insulating layer is reduced. As the insulating layer, an insulating layer containing nitrogen is preferably used.

Note that the above-described "oxygen doping" means that oxygen (which includes at least one of an oxygen radical, an oxygen atom, an oxygen molecule, ozone, an oxygen ion (oxygen molecular ion), and/or an oxygen cluster ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

For the oxygen doping treatment, a gas containing oxygen can be used. As the gas containing oxygen, oxygen, dinitrogen monoxide, nitrogen dioxide, carbon dioxide, carbon monoxide, or the like can be used. Further, a rare gas may be used in the oxygen doping treatment.

By the above oxygen doping treatment, at least one oxygen excess region where contained oxygen exceeds the stoichiometric composition of the insulating layer can be provided in a bulk of the insulating layer or at an interface between the insulating layer and the oxide semiconductor layer.

One embodiment of the present invention relates to a semiconductor device including a transistor or a semiconductor device including a circuit which is formed with a transistor. For example, one embodiment of the present invention relates to a semiconductor device including a transistor in which a channel formation region is formed using an oxide semiconductor or a semiconductor device including a circuit which is formed with such a transistor. For example, one embodiment of the present invention relates to an LSI, a CPU, a power device mounted in a power circuit, a semiconductor integrated circuit including a memory, a thyristor, a converter, an image sensor, or the like, an electro-optical device typified by a liquid crystal display panel, a light-emitting display device including a light-emitting element, or an electronic device including the aforementioned device as a component.

According to one embodiment of the present invention, a highly reliable semiconductor device which includes an oxide semiconductor and achieves stable electric characteristics can be provided.

BRIEF DESCRIPTION OF THE DRAWINGS

FIGS. 5A and 5B are a plan view and a cross-sectional view illustrating one embodiment of a semiconductor device.

FIGS. 9A to 9C illustrate an electronic device.

DETAILED DESCRIPTION OF THE INVENTION

Figure 1A:
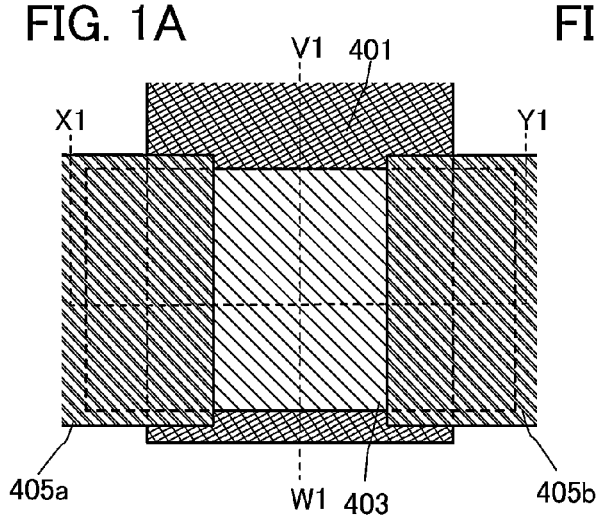
FIGS. 1A to 1C are a plan view and cross-sectional views illustrating one embodiment of a semiconductor device.

Hereinafter, embodiments of the invention disclosed in this specification will be described with reference to the accompanying drawings. Note that the invention disclosed in this specification is not limited to the following description, and it is easily understood by those skilled in the art that modes and details of the invention can be modified in various ways. Therefore, the invention disclosed in this specification is not construed as being limited to the description of the following embodiments. Note that in structures of the present invention described below, like portions or portions having similar functions are denoted by the same reference numerals in different drawings, and description thereof is not repeated. Further, the same hatching pattern is applied to portions having similar functions, and the portions are not especially denoted by reference numerals in some cases.

In this specification, ordinal numbers such as "first", "second", and the like are used in order to avoid confusion among components, and the terms do not limit the components numerically.

Embodiment 1

In this embodiment, one embodiment of a semiconductor device and one embodiment of a method for manufacturing the semiconductor device will be described with reference to FIGS. 1A to 1C and FIGS. 2A to 2E. In this embodiment, a transistor including an oxide semiconductor layer is shown as an example of the semiconductor device.

Figure 1C:
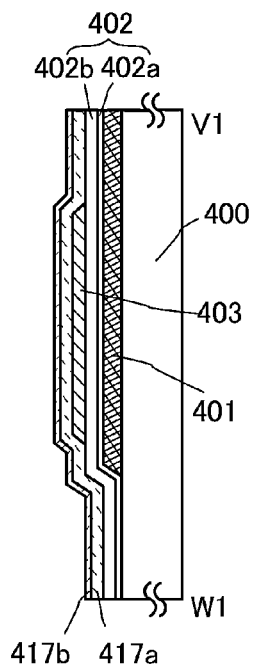
Figure 1B:
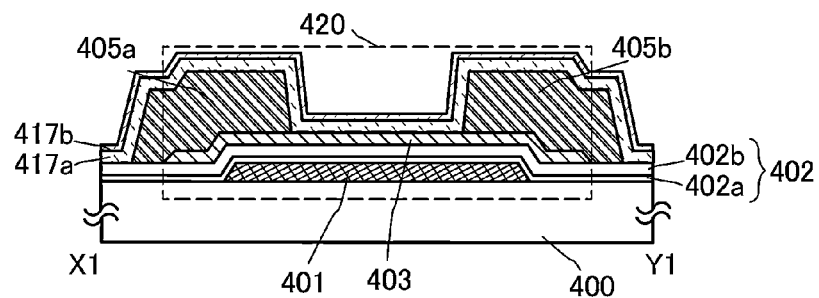

FIGS. 1A to 1C illustrate a structure example of a transistor 420. FIG. 1A is a plan view of the transistor 420, FIG. 1B is a cross-sectional view taken along line X1-Y1 in FIG. 1A, and FIG. 1C is a cross-sectional view taken along line V1-W1 in FIG. 1A. Note that in FIG. 1A, some components of the transistor 420 (e.g., an aluminum oxide film 417b and the like) are not illustrated in order to avoid complexity.

The transistor 420 illustrated in FIGS. 1A to 1C includes a gate electrode layer 401 provided over a substrate 400, a gate insulating layer 402 provided over the gate electrode layer 401, an oxide semiconductor layer 403 overlapping with the gate electrode layer 401 with the gate insulating layer 402 interposed therebetween, a source electrode layer 405a and a drain electrode layer 405b electrically connected to the oxide semiconductor layer 403, an insulating layer 417a which covers the source electrode layer 405a and the drain electrode layer 405b and is in contact with the oxide semiconductor layer 403, and the aluminum oxide film 417b provided over the insulating layer 417a.

In the gate insulating layer 402 included in the transistor 420 described in this embodiment, a gate insulating layer 402a and a gate insulating layer 402b are stacked in this order over the gate electrode layer 401. However, the gate insulating layer of this embodiment of the present invention is not limited thereto, and the gate insulating layer may have a single-layer structure, or a stacked structure including three or more layers.

In the transistor 420 described in this embodiment, the insulating layer 417a in contact with the oxide semiconductor layer 403 has a single-layer structure or a stacked structure and includes a region containing oxygen in excess of the stoichiometric composition. Such a region is formed by oxygen doping treatment. In the case where the insulating layer 417a has a stacked structure, it is preferable that a region containing excess oxygen be included in at least a portion in contact with the oxide semiconductor layer 403.

Note that as the insulating layer 417a, an insulating layer containing nitrogen is preferably used. The number of bonds of nitrogen is three, which is larger than that of oxygen having two bonds. Thus, when oxygen doping treatment is performed in order to form an oxygen excess region in the insulating layer in contact with the oxide semiconductor layer, by using an insulating layer containing nitrogen (e.g., a silicon oxynitride film), a large amount of introduced oxygen can be kept in the insulating layer as compared with the case of using an oxide insulating layer (e.g., a silicon oxide film) as the insulating layer. As a result, an oxygen excess region can be easily formed in the insulating layer in contact with the oxide semiconductor layer, or a larger amount of oxygen can be contained in the insulating layer.

In this embodiment, as the insulating layer 417a, a silicon oxynitride film including an oxygen excess region is used.

The aluminum oxide film 417b provided over and in contact with the insulating layer 417a is a film obtained by oxidizing an aluminum film. When the aluminum oxide film 417b is formed by oxidization of an aluminum film, productivity can be increased as compared with the case where an aluminum oxide film is deposited by a sputtering method. Further, the aluminum film can be oxidized in the same step as oxygen doping treatment performed on the insulating layer 417a, which makes a process to be simplified. As a result, the manufacturing cost can be reduced.

The aluminum oxide film 417b has a high shielding effect (blocking effect) of preventing penetration of both oxygen and impurities such as hydrogen or moisture. Thus, by using an aluminum oxide film as an insulating layer covering the transistor, release of oxygen from the oxide semiconductor layer 403 and the insulating layer 417a in contact with the oxide semiconductor layer 403 can be prevented, and in addition, entry of water and hydrogen into the oxide semiconductor layer 403 can be prevented.

When the density of the aluminum oxide film is set to high (the film density is higher than or equal to $3.2$ g/cm$^3$, preferably higher than or equal to $3.6$ g/cm$^3$), the transistor 420 can have stable electric characteristics. The film density can be measured by Rutherford backscattering spectrometry (RBS) or X-ray reflection (XRR).

In this embodiment, it is preferable that the oxide semiconductor layer 403 be the one which is highly purified and hardly contains impurities such as copper, aluminum, and chlorine. In the process for manufacturing the transistor, steps in which these impurities are neither taken into nor attached to the surface of the oxide semiconductor layer are preferably selected as appropriate. In the case where the impurities are attached to the surface of the oxide semiconductor layer, the impurities on the surface of the oxide semiconductor layer are preferably removed by exposure to oxalic acid or dilute hydrofluoric acid or plasma treatment (such as $N_2O$ plasma treatment). Specifically, the copper concentration of the oxide semiconductor layer is lower than or equal to $1\times10^{18}$ atoms/cm$^3$, preferably lower than or equal to $1\times10^{17}$ atoms/cm$^3$. In addition, the aluminum concentration of the oxide semiconductor layer is lower than or equal to $1\times10^{18}$ atoms/cm$^3$. Further, the chlorine concentration of the oxide semiconductor layer is lower than or equal to $2\times10^{18}$ atoms/cm$^3$.

Further, it is preferable that impurities such as water or hydrogen be removed from the oxide semiconductor layer 403 as much as possible. For example, in the transistor 420, the hydrogen concentration in the oxide semiconductor layer 403 is lower than or equal to $2\times10^{19}$ atoms/cm$^3$, preferably lower than or equal to $5\times10^{18}$ atoms/cm$^3$, further preferably lower than or equal to $2\times10^{18}$ atoms/cm$^3$.

An example of a method for manufacturing the transistor 420 described in FIGS. 1A to 1C is described with reference to FIGS. 2A to 2E.

Figure 2A:
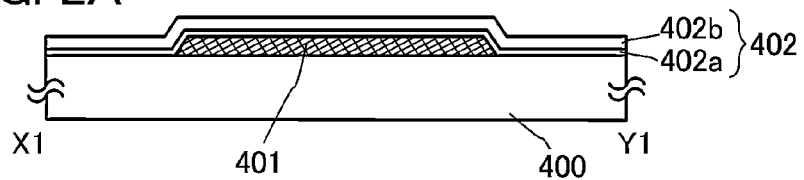
FIGS. 2A to 2E are cross-sectional views illustrating one embodiment of a method for manufacturing a semiconductor device.

First, the gate electrode layer 401 is formed over the substrate 400 having an insulating surface, and then over the gate electrode layer 401, the gate insulating layer 402a and the gate insulating layer 402b are stacked in this order, so that the gate insulating layer 402 is formed (see FIG. 2A).

There is no particular limitation on a substrate that can be used as the substrate 400 having an insulating surface as long as it has heat resistance high enough to withstand heat treatment performed later. For example, variety kinds of glass substrates used in the electronics industry, such as a glass substrate of barium borosilicate glass, aluminoborosilicate glass, or the like, can be used. Note that as the substrate, a substrate having a thermal expansion coefficient of greater than or equal to $25\times10^{-7}$/° C. and less than or equal to $50\times10^{-7}$/° C. (preferably greater than or equal to $30\times10^{-7}$/° C. and less than or equal to $40\times10^{-7}$/° C.) and a strain point of higher than or equal to 650° C. and lower than or equal to 750° C. (preferably higher than or equal to 700° C. and lower than or equal to 740° C.) is preferably used.

In the case where a large-sized substrate having the size of the fifth generation (1000 mm×1200 mm or 1300 mm×1500 mm), the sixth generation (1500 mm×1800 mm), the seventh generation (1870 mm×2200 mm), the eighth generation (2200 mm×2500 mm), the ninth generation (2400 mm×2800 mm), the tenth generation (2880 mm×3130 mm), or the like is used, minute processing might become difficult owing to shrinkage of the substrate caused by heat treatment or the like in the manufacturing process of a semiconductor device. Therefore, when such a large-sized glass substrate is used as the substrate, the one with a small shrinkage is preferably used. For example, a large-sized glass substrate which has a shrinkage of 20 ppm or less, preferably 10 ppm or less, further preferably 5 ppm or less after heat treatment preferably at 450° C., further preferably at 500° C. for one hour may be used as the substrate.

Alternatively, as the substrate 400, a ceramic substrate, a quartz substrate, a sapphire substrate, or the like can be used. Alternatively, a single crystal semiconductor substrate or a polycrystalline semiconductor substrate made of silicon or silicon carbide, a compound semiconductor substrate made of silicon germanium or the like, an SOI substrate, or the like can be used. Still alternatively, a component in which a semiconductor element is provided over any of these substrates may be used as the substrate 400.

The semiconductor device may be manufactured using a flexible substrate as the substrate 400. In order to manufacture a flexible semiconductor device, the transistor 420 including the oxide semiconductor layer 403 may be directly formed over a flexible substrate; or alternatively, the transistor 420 including the oxide semiconductor layer 403 may be formed over a manufacturing substrate and then separated and transferred to a flexible substrate. Note that in order to separate the transistor 420 from the manufacturing substrate and transfer it to the flexible substrate, a separation layer may be provided between the manufacturing substrate and the transistor 420 including the oxide semiconductor layer.

A base insulating layer may be provided over the substrate 400. The base insulating layer can be formed by a plasma CVD method, a sputtering method, or the like using an oxide insulating film such as a silicon oxide film, a silicon oxynitride film, an aluminum oxide film, an aluminum oxynitride film, a hafnium oxide film, or a gallium oxide film, a nitride insulating film such as a silicon nitride film, a silicon nitride oxide film, an aluminum nitride film, or an aluminum nitride oxide film, or a mixed material thereof.

The substrate 400 (or the substrate 400 and the base insulating layer) may be subjected to heat treatment. For example, the heat treatment can be performed at 650° C. for one minute to 5 minutes with a gas rapid thermal annealing (GRTA) apparatus which performs a heat treatment using a high-temperature gas. As the high-temperature gas in the GRTA apparatus, an inert gas which does not react by a heat treatment with an object to be processed, such as nitrogen or a rare gas like argon, is used. Alternatively, the heat treatment may be performed at 500° C. for 30 minutes to one hour with an electric furnace.

The gate electrode layer 401 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked structure of the above conductive material and the above metal material.

As the gate electrode layer 401, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV (electron volts) or higher, preferably 5.5 eV or higher, which enables the threshold voltage to be positive when used as the gate electrode layer. Accordingly, a so-called normally-off switching element can be obtained.

In this embodiment, the gate electrode layer 401 is formed using a 100-nm-thick tungsten film by a sputtering method.

The substrate 400 and the gate electrode layer 401 may be subjected to heat treatment after the gate electrode layer 401 is formed. For example, the heat treatment may be performed with a GRTA apparatus at 650° C. for one minute to 5 minutes. Alternatively, the heat treatment may be performed at 500° C. for 30 minutes to one hour with an electric furnace.

To improve the coverage with the gate insulating layer 402, planarization treatment may be performed on a surface of the gate electrode layer 401. It is preferable that the flatness of the surface of the gate electrode layer 401 be good particularly when the thickness of the gate insulating layer 402 is small.

The gate insulating layer 402a can be formed using a nitride insulating layer by a plasma-enhanced CVD method, a sputtering method, or the like, which is preferable. For example, a silicon nitride film and a silicon nitride oxide film can be given. When a nitride insulating layer is used as the gate insulating layer 402a in contact with the gate electrode layer 401 and the substrate 400, an effect of preventing diffusion of impurities from the gate electrode layer 401 or the substrate 400 can be obtained.

As the gate insulating layer 402a, it is possible to use, for example, a metal oxide insulating film containing one or more elements selected from metal elements such as aluminum (Al), titanium (Ti), molybdenum (Mo), tungsten (W), hafnium (Hf), tantalum (Ta), lanthanum (La), zirconium (Zr), nickel (Ni), magnesium (Mg), and barium (Ba) (e.g., an aluminum oxide film, an aluminum oxynitride film, a hafnium oxide film, a magnesium oxide film, a zirconium oxide film, a lanthanum oxide film, or a barium oxide film) or a metal nitride insulating film containing any of these metal elements as its component (e.g., an aluminum nitride film or an aluminum nitride oxide film). Alternatively, as the gate insulating layer 402a, a gallium oxide film, an In—Zr—Zn-based oxide film, an In—Fe—Zn-based oxide film, an In—Ce—Zn-based oxide film, or the like can be used.

In this embodiment, as the gate insulating layer 402a, a 30-nm-thick silicon nitride film which is formed by a plasma-enhanced CVD method is used.

The gate insulating layer 402b can be formed to a thickness greater than or equal to 100 nm and less than or equal to 350 nm by a sputtering method, a molecular beam epitaxy (MBE) method, a CVD method, a pulsed laser deposition method, an atomic layer deposition (ALD) method, or the like as appropriate. The gate insulating layer 402b may be formed with a sputtering apparatus which performs film formation with surfaces of a plurality of substrates set substantially perpendicular to a surface of a sputtering target.

The gate insulating layer 402b can be formed using a silicon oxide film, a gallium oxide film, an aluminum oxide film, a silicon nitride film, a silicon oxynitride film, an aluminum oxynitride film, or a silicon nitride oxide film.

When the gate insulating layer 402b is formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, gate leakage current can be reduced.

In this embodiment, a 200-nm-thick silicon oxynitride film is deposited by a high-density plasma CVD method. The deposition cycle in the case of using a CVD method can be made shorter than that of the case of using a sputtering method. In addition, in the case of using a CVD method, variation in film quality of the deposited plane is small and particles are less likely to enter the silicon oxynitride film, as compared with the case of using a sputtering method. Thus, in the case where the substrate has a large size, a CVD method is preferably used for deposition of the gate insulating layer 402.

Note that since the gate insulating layer 402b is an insulating layer in contact with the oxide semiconductor layer 403, it is preferable to contain oxygen and also preferable to contain impurities such as water or hydrogen as little as possible. In the case of using a plasma CVD method, it is more difficult to reduce the concentration of hydrogen in the layer than the case of using a sputtering method. Thus, in this embodiment, heat treatment for reducing (preferably, removing) hydrogen atoms (the treatment is dehydration or dehydrogenation treatment) is performed on the deposited gate insulating layer 402.

The heat treatment is performed at a temperature higher than or equal to 250° C. and lower than or equal to 650° C., preferably higher than or equal to 450° C. and lower than or equal to 600° C. or lower than the strain point of the substrate. For example, the substrate is introduced into an electric furnace which is one of heat treatment apparatuses, and heat treatment is performed on the gate insulating layer 402 at 650° C. for one hour in vacuum (under reduced pressure).

Note that the heat treatment apparatus is not limited to the electric furnace, and an apparatus for heating an object by heat conduction or heat radiation from a heater such as a resistance heater may be used. For example, a rapid thermal annealing (RTA) apparatus such as a GRTA apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. Note that in the case where a GRTA apparatus is used as the heat treatment apparatus, the substrate may be heated in an inert gas heated to a high temperature of 650° C. to 700° C. because the heat treatment time is short.

The heat treatment may be performed in an atmosphere of nitrogen, oxygen, ultra-dry air (air in which a water content is 20 ppm or less, preferably 1 ppm or less, further preferably 10 ppb or less), or a rare gas (argon, helium, or the like). Note that it is preferable that water, hydrogen, or the like be not contained in the atmosphere of nitrogen, oxygen, ultra-dry air, or a rare gas. It is also preferable that the purity of nitrogen, oxygen, or the rare gas which is introduced into the heat treatment apparatus be set to be 6N (99.9999%) or higher, preferably 7N (99.99999%) or higher (that is, the impurity concentration is 1 ppm or lower, preferably 0.1 ppm or lower).

With the heat treatment, the gate insulating layer 402 can be dehydrated or dehydrogenated, whereby the gate insulating layer 402 from which impurities such as hydrogen or water, which cause a change in characteristics of a transistor, are removed can be formed.

In heating treatment where dehydration or dehydrogenation treatment is performed, it is preferable that a surface of the gate insulating layer 402 be not in a state where hydrogen, water, or the like is prevented from being released (for example, by providing a film or the like which is not permeable to (or blocks) hydrogen, water, or the like), but in a state where the surface of the gate insulating layer 402 is exposed.

The heat treatment for dehydration or dehydrogenation may be performed plural times, and may also serve as another heat treatment.

Figure 2B:
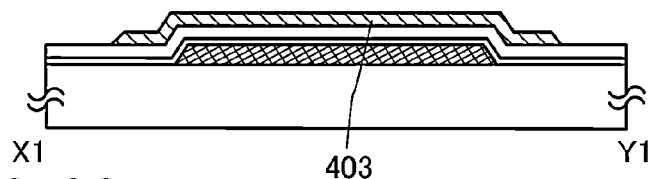
Figure 2C:
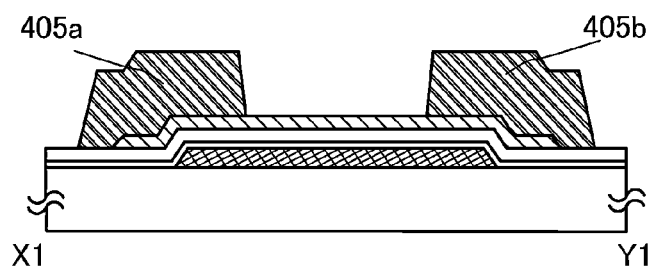

Next, an oxide semiconductor layer is deposited over the gate insulating layer 402 and then processed into an island shape to form the oxide semiconductor layer 403 (see FIG. 2B).

Note that it is preferable that the gate insulating layer 402 and the oxide semiconductor layer be formed successively without exposing the gate insulating layer 402 to air. The successive formation of the gate insulating layer 402 and the oxide semiconductor layer without exposing the gate insulating layer 402 to air can prevent impurities such as hydrogen or moisture from adsorbing onto the surface of the gate insulating layer 402.

Further, after the oxide semiconductor layer is formed, heat treatment for reducing or removing excess hydrogen (including water and a hydroxyl group) in the oxide semiconductor layer (dehydration or dehydrogenation) is preferably performed. The temperature of the heat treatment is higher than or equal to 300° C. and lower than or equal to 700° C., or lower than the strain point of the substrate. The heat treatment can be performed under reduced pressure or in a nitrogen atmosphere, or the like.

The heat treatment enables hydrogen, which is an impurity imparting n-type conductivity, in the oxide semiconductor layer to be reduced (further preferably removed). Further, in the case where an insulating layer containing oxygen is employed as the gate insulating layer 402, by this heat treatment, oxygen contained in the gate insulating layer 402 can be supplied to the oxide semiconductor layer. While oxygen is released from the oxide semiconductor layer by the dehydration or dehydrogenation treatment, oxygen is supplied from the gate insulating layer 402 to the oxide semiconductor layer, whereby oxygen vacancies in the oxide semiconductor layer can be filled.

Note that in the case where an insulating layer containing oxygen is employed as the gate insulating layer 402, it is preferable that heat treatment for dehydration or dehydrogenation of the oxide semiconductor layer be performed before the oxide semiconductor layer is processed into the island-shaped oxide semiconductor layer 403. This is because oxygen contained in the gate insulating layer 402 can be prevented from being released by the heat treatment.

The heat treatment for dehydration or dehydrogenation may serve as another heat treatment in a manufacturing process of the transistor 420.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor layer is heated in the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor and that has been reduced by the step of removing an impurity for the dehydration or dehydrogenation, so that the oxide semiconductor layer can have high purity and be an i-type (intrinsic) oxide semiconductor layer.

The oxide semiconductor layer 403 may have either a single-layer structure or a stacked structure. Further, the oxide semiconductor layer may have either an amorphous structure or a crystalline structure. In the case where the oxide semiconductor layer 403 has an amorphous structure, heat treatment may be performed on the oxide semiconductor layer 403 in a later manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., further preferably higher than or equal to 500° C., still further preferably higher than or equal to 550° C. Note that the heat treatment can also serve as another heat treatment in the manufacturing process.

For deposition of the oxide semiconductor layer, a sputtering method, a MBE method, a CVD method, a pulse laser deposition method, an ALD method, or the like can be used as appropriate. The oxide semiconductor layer may be formed with a sputtering apparatus which performs deposition in the state where surfaces of a plurality of substrates are substantially perpendicular to a sputtering target surface.

In the formation of the oxide semiconductor layer, the hydrogen concentration in the oxide semiconductor layer is preferably reduced as much as possible. In order to reduce the hydrogen concentration, for example, in the case where a sputtering method is used for the deposition, a high-purity rare gas (typically, argon) from which impurities such as hydrogen, water, a hydroxyl group, or a hydride have been removed; oxygen; or a mixed gas of oxygen and the rare gas is used as appropriate as an atmosphere gas supplied to a deposition chamber of a sputtering apparatus.

The oxide semiconductor layer is deposited in such a manner that a sputtering gas from which hydrogen and moisture are removed is introduced into a deposition chamber while moisture remaining in the deposition chamber is removed, whereby the concentration of hydrogen in the deposited oxide semiconductor layer can be reduced. In order to remove moisture remaining in the deposition chamber, an entrapment vacuum pump such as a cryopump, an ion pump, or a titanium sublimation pump is preferably used. The evacuation unit may be a turbo molecular pump provided with a cold trap. When the deposition chamber is evacuated with the cryopump, which has a high capability in removing a hydrogen molecule, a compound containing a hydrogen atom such as water ($H_2O$) (more preferably, also a compound containing a carbon atom), and the like, the impurity concentration in the oxide semiconductor layer deposited in the deposition chamber can be reduced.

Further, when the oxide semiconductor layer is deposited by a sputtering method, the relative density (filling rate) of a metal oxide target that is used for the deposition is greater than or equal to 90% and less than or equal to 100%, preferably greater than or equal to 95% and less than or equal to 99.9%. With use of a metal oxide target with a high relative density, a dense oxide semiconductor layer can be deposited.

Further, for reducing the impurity concentration in the oxide semiconductor layer, it is also effective to form the oxide semiconductor layer while the substrate 400 is kept at high temperature. The temperature at which the substrate 400 is heated may be higher than or equal to 150° C. and lower than or equal to 450° C.; the substrate temperature is preferably higher than or equal to 200° C. and lower than or equal to 350° C. By heating the substrate at a high temperature in the formation, the crystalline oxide semiconductor layer can be formed.

An oxide semiconductor used for the oxide semiconductor layer 403 preferably contains at least indium (In) or zinc (Zn). In particular, both In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by a chemical formula, $In_2SnO_5(ZnO)_n$ (n>0, n is a natural number) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation on the materials given above, a material with an appropriate composition may be used depending on needed semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

It is preferable to use a high-purity gas from which impurities such as hydrogen, water, a hydroxyl group, or a hydride are removed as a sputtering gas used when the oxide semiconductor layer is formed.

The oxide semiconductor layer 403 is preferably a CAAC-OS (c-axis aligned crystalline oxide semiconductor) film.

The CAAC-OS film is not completely single crystal or completely amorphous. The CAAC-OS film is an oxide semiconductor layer with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light is small. Thus, the transistor has high reliability.

In the case where a CAAC-OS film is employed as the oxide semiconductor layer 403, the following three methods can be used for forming the CAAC-OS film as examples. One of methods is to form an oxide semiconductor layer at a film formation temperature higher than or equal to 200° C. and lower than or equal to 450° C., thereby obtaining c-axis alignment substantially perpendicular to a surface. Another method is to form a thin oxide semiconductor layer and then subject the layer to heat treatment performed at a temperature higher than or equal to 200° C. and lower than or equal to 700° C., thereby obtaining c-axis alignment substantially perpendicular to a surface. The other method is to form a first thin oxide semiconductor layer, subject the layer to heat treatment performed at a temperature higher than or equal to 200° C. and lower than or equal to 700° C., and then form a second oxide semiconductor layer, thereby obtaining c-axis alignment substantially perpendicular to a surface.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Before the formation of the oxide semiconductor layer, planarization treatment may be performed on the surface on which the oxide semiconductor layer is to be formed. The planarization treatment may be, but not particularly limited to, polishing treatment (such as chemical mechanical polishing (CMP)), dry etching treatment, or plasma treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of argon, nitrogen, helium, oxygen or the like may be used. The reverse sputtering can remove particle substances (also referred to as particles or dust) attached to the surface on which the oxide semiconductor layer is to be formed.

As the planarization treatment, polishing treatment, dry etching treatment, or plasma treatment may be performed plural times, or these treatments may be performed in combination. In the case where the treatments are combined, the order of steps may be set as appropriate, without particular limitation, depending on the unevenness of the surface on which the oxide semiconductor layer is to be formed.

Next, a conductive film that is to be a source electrode layer and a drain electrode layer (including a wiring formed in the same layer as the source electrode layer and the drain electrode layer) is formed over the gate electrode layer 401, the gate insulating layer 402 and the oxide semiconductor layer 403.

The conductive film is formed using a material that can withstand heat treatment in a later step. As a conductive film used for the source electrode layer and the drain electrode layer, for example, a metal film containing an element selected from Al, Cr, Cu, Ta, Ti, Mo, and W and a metal nitride film containing any of the above elements as its main component (a titanium nitride film, a molybdenum nitride film, and a tungsten nitride film) can be used. Alternatively, a film of a high-melting-point metal such as Ti, Mo, or W or a metal nitride film of any of these elements (a titanium nitride film, a molybdenum nitride film, or a tungsten nitride film) may be stacked on one of or both a bottom side and a top side of a metal film of Al, Cu, or the like. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$: abbreviated to ITO), indium oxide-zinc oxide ($In_2O_3$—ZnO), or any of these metal oxide materials in which silicon oxide is contained can be used.

Through a photolithography step, a resist mask is formed over the conductive film, and the source electrode layer 405a and the drain electrode layer 405b are formed by selective etching. After the source electrode layer 405a and the drain electrode layer 405b are formed, the resist mask is removed (see FIG. 2C).

Ultraviolet, KrF laser light, ArF laser light, or the like can be used for light exposure at the time of forming a resist mask. The channel length L of the transistor 420 that is to be completed later is determined by a distance between bottom edges of the source electrode layer 405a and the drain electrode layer 405b which are adjacent to each other over the oxide semiconductor layer 403. In the case where the channel length L is less than 25 nm, the light exposure at the time of forming the resist mask can be performed using extreme ultraviolet having an extremely short wavelength of several nanometers to several tens of nanometers. In the light exposure by extreme ultraviolet light, the resolution is high and the focus depth is large. Thus, the channel length L of the transistor that is completed later can be 10 nm to 1000 nm inclusive and the operation speed of a circuit can be increased.

In order to reduce the number of photomasks used in a photolithography step and reduce the number of photolithography steps, an etching step may be performed with use of a multi-tone mask which is a light-exposure mask through which light is transmitted to have a plurality of intensities. A resist mask formed with use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed with one multi-tone mask. Thus, the number of light-exposure masks can be reduced and the number of corresponding photolithography steps can be also reduced, whereby simplification of a process can be realized.

In this embodiment, the conductive film can be etched using a gas containing chlorine, for example, a gas containing chlorine ($Cl_2$), boron trichloride ($BCl_3$), silicon tetrachloride ($SiCl_4$), or carbon tetrachloride ($CCl_4$). Alternatively, a gas containing fluorine such as a gas containing carbon tetrafluoride ($CF_4$), sulfur hexafluoride ($SF_6$), nitrogen trifluoride ($NF_3$), or trifluoromethane ($CHF_3$) can be used. Alternatively, any of these gases to which a rare gas such as helium (He) or argon (Ar) is added, or the like can be used.

As the etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

The conductive film used in this embodiment is a stacked layer of a titanium film with a thickness of 100 nm, an aluminum film with a thickness of 400 nm, and a titanium film with a thickness of 100 nm, which are formed by a sputtering method. As the etching of the conductive film, the stacked layer of the titanium film, the aluminum film, and the titanium film is etched by a dry etching method, and the source electrode layer 405a and the drain electrode layer 405b are formed.

In this embodiment, the upper titanium film and the aluminum film are etched under first etching conditions and then the lower titanium film is etched under second etching conditions. The first etching conditions are as follows: an etching gas ($BCl_3$:$Cl_2$=750 sccm:150 sccm) is used, the bias power is 1500 W, the ICP power is 0 W, and the pressure is 2.0 Pa. The second etching conditions are as follows: an etching gas ($BCl_3$:$Cl_2$=700 sccm:100 sccm) is used, the bias power is 750 W, the ICP power is 0 W, and the pressure is 2.0 Pa.

Note that it is preferable that etching conditions be optimized so as not to etch and divide the oxide semiconductor layer 403 when the conductive film is etched. However, it is difficult to obtain etching conditions in which only the conductive film is etched and the oxide semiconductor layer 403 is not etched at all. In some cases, only part of the oxide semiconductor layer 403 is etched to be an oxide semiconductor layer having a groove portion (a recessed portion) when the conductive film is etched.

Next, an insulating layer 427a which covers the source electrode layer 405a and the drain electrode layer 405b and is in contact with part of the oxide semiconductor layer 403 is formed.

The insulating layer 427a in contact with the oxide semiconductor layer 403 can be formed using a silicon oxide film, a gallium oxide film, an aluminum oxide film, a silicon nitride film, a silicon oxynitride film, an aluminum oxynitride film, or a silicon nitride oxide film. Note that an oxide insulating layer containing nitrogen is preferably used as the insulating layer 427a. For example, an inorganic insulating layer such as a silicon oxynitride film or a silicon nitride oxide film can be used as the insulating layer 427a. The preferable thickness of the insulating layer 427a is greater than or equal to 50 nm and less than or equal to 100 nm.

In this embodiment, as the insulating layer 427a, a silicon oxynitride film is formed by a plasma CVD method.

Note that like the gate insulating layer 402b, the insulating layer 427a preferably contains impurities such as water or hydrogen as little as possible because it is an insulating layer in contact with the oxide semiconductor layer 403. Thus, in this embodiment, after formation of the insulating layer 427a, heat treatment for removing hydrogen atoms (dehydration or dehydrogenation) is performed thereon. Note that the heat treatment for dehydration or dehydrogenation of the insulating layer 427a is preferably performed after the insulating layer 427a is formed and before an aluminum film 427b is formed because an aluminum oxide film has a blocking function of preventing penetration of hydrogen, water, or the like therethrough.

The heat treatment is performed at a temperature higher than or equal to 250° C. and lower than or equal to 650° C., preferably higher than or equal to 450° C. and lower than or equal to 600° C. or lower than the strain point of the substrate. The details of heat treatment for dehydration or dehydrogenation are the same as those of the gate insulating layer 402b.

Figure 2D:
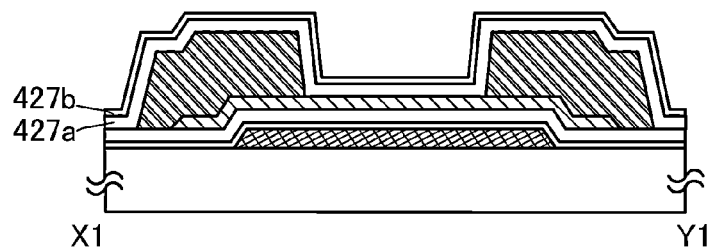
Figure 2E:
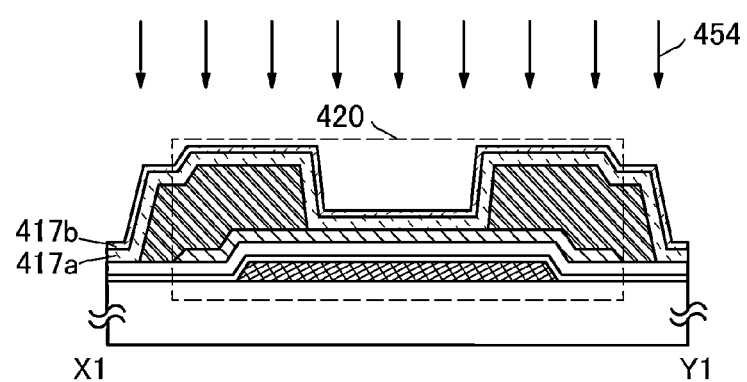

Next, the aluminum film 427b is formed over the insulating layer 427a (see FIG. 2D).

The aluminum film 427b is preferably formed by a sputtering method, an evaporation method, a CVD method, or the like. The preferable thickness of the aluminum film 427b is greater than or equal to 5 nm and less than or equal to 20 nm.

Next, treatment for introducing oxygen 454 (also referred to as oxygen doping treatment or oxygen implantation treatment) is performed on the insulating layer 427a which has been subjected to the dehydration or dehydrogenation treatment and the aluminum film 427b. As a result, the insulating layer 417a including an oxygen excess region and the aluminum oxide film 417b which is an oxide of the aluminum film 427b are formed (see FIG. 2E).

The oxygen 454 contains at least any of an oxygen radical, ozone, an oxygen atom, and an oxygen ion (an oxygen molecular ion and/or an oxygen cluster ion). By the oxygen doping treatment performed on the dehydrated or dehydrogenated insulating layer, oxygen can be contained in the insulating layer to compensate for oxygen which has been potentially released by the above heat treatment, and an oxygen excess region can be formed.

Introducing the oxygen 454 into the insulating layer 427a and the aluminum film 427b can be performed by an ion implantation method, an ion doping method, a plasma immersion ion implantation method, plasma treatment, or the like. Note that for the ion implantation method, a gas cluster ion beam may be used. The oxygen 454 may be introduced to the entire area of the substrate 400 at a time. Alternatively, a linear ion beam is used for introducing the oxygen 454. In the case of using the linear ion beam, the substrate or the ion beam is relatively moved (scanned), whereby the oxygen 454 can be introduced into the entire areas of the insulating layer 427a and the aluminum film 427b.

As a gas for supplying the oxygen 454, a gas containing oxygen may be used. For example, an $O_2$ gas, an $N_2O$ gas, a $CO_2$ gas, a CO gas, a $NO_2$ gas, or the like can be used. Note that a rare gas (e.g., argon) may be contained in a gas for supplying oxygen.

Further, in the case where an ion implantation method is used for introducing oxygen, the dose of the oxygen 454 is preferably greater than or equal to $1\times10^{13}$ ions/cm$^2$ and less than or equal to $5\times10^{16}$ ions/cm$^2$. The content of oxygen in the insulating layer 417a after the oxygen doping treatment preferably exceeds that of the stoichiometric composition. Further, in the aluminum oxide film 417b, a region containing oxygen in excess of the stoichiometric composition may be formed. Note that such a region containing oxygen in excess of the stoichiometric composition may exist in part of the insulating layer 417a. The depth at which oxygen is implanted may be adjusted as appropriate by implantation conditions.

In the case where an oxynitride insulating layer (e.g., a silicon oxynitride film) is used as the insulating layer 417a, oxygen is one of main components in the oxynitride insulating layer. Thus, it is difficult to accurately estimate the oxygen concentration of the oxynitride insulating layer with secondary ion mass spectrometry (SIMS) or the like. In other words, it is difficult to judge whether oxygen is intentionally added to the oxynitride insulating layer or not. Further, the same can be applied to the case where oxygen contained excessively in the insulating layer 417a is supplied to the oxide semiconductor layer in a later step.

As for oxygen, it is known that oxygen contains isotopes such as $^{17}O$ and $^{18}O$ and the proportions of $^{17}O$ and $^{18}O$ in all of the oxygen atoms in nature is about 0.038% and about 0.2%, respectively. That is to say, it is possible to measure the concentrations of these isotopes in the oxide semiconductor layer or the insulating layer in contact with the oxide semiconductor layer by a method such as SIMS; therefore, the oxygen concentration of the oxide semiconductor layer or the insulating layer in contact with the oxide semiconductor layer may be able to be estimated more accurately by measuring the concentrations of these isotopes. Thus, the concentration of the isotope may be measured to determine whether oxygen is intentionally added to the insulating layer in contact with the oxide semiconductor layer.

Note that after the oxygen 454 is added to the insulating layer 427a and the aluminum film 427b, heat treatment may be performed. By this heat treatment, oxygen contained in the insulating layer 417a is supplied to the oxide semiconductor layer 403 to fill oxygen vacancies in the oxide semiconductor layer 403.

Through the above-described steps, the transistor 420 of this embodiment can be formed.

In the transistor including an oxide semiconductor, oxygen is supplied from the insulating layer to the oxide semiconductor layer, whereby the interface state density between the oxide semiconductor layer and the insulating layer can be reduced. As a result, carrier trapping at the interface between the oxide semiconductor layer and the insulating layer, caused by the operation of a transistor or the like, can be suppressed, and thus, a transistor with high reliability can be obtained.

Further, charge is generated due to oxygen vacancies in the oxide semiconductor layer in some cases. In general, some of oxygen vacancies in an oxide semiconductor layer serve as a donor and causes release of an electron which is a carrier. As a result, the threshold voltage of a transistor shifts in the negative direction. When oxygen is sufficiently supplied from the insulating layer to the oxide semiconductor layer so that the oxide semiconductor layer preferably contains excessive oxygen, the density of oxygen vacancies in the oxide semiconductor layer, which cause the negative shift of the threshold voltage, can be reduced.

The excess oxygen contained in the insulating layer 417a is supplied to the oxide semiconductor layer 403 in contact with the insulating layer 417a by heat treatment performed in the process for manufacturing a transistor. Thus, in the transistor 420, an oxygen excess region is formed at the interface between the insulating layer 417a and the oxide semiconductor layer 403 or at least in part of the oxide semiconductor layer 403 (in a bulk). Note that a heat treatment step for supplying oxygen from the insulating layer 417a to the oxide semiconductor layer 403 may be performed.

The insulating layer may be subjected to dehydration or dehydrogenation treatment and/or oxygen doping treatment plural times.

Further, the aluminum oxide film 417b provided over and in contact with the insulating layer 417a is a film formed by oxidizing an aluminum film. When the aluminum oxide film 417b is formed by oxidization of the aluminum film, productivity can be increased as compared with the case where an aluminum oxide film is deposited by a sputtering method. In addition, the aluminum film can be oxidized in the same step as oxygen doping treatment performed on the insulating layer 417a; thus, the process can be simplified. Therefore, the cost for manufacturing a semiconductor device can be reduced.

Although not illustrated, a planarization insulating layer for planarization may be provided over the transistor 420. The planarization insulating layer can be formed using a heat-resistant organic material such as a polyimide resin, an acrylic resin, a polyimide amide resin, a benzocyclobutene-based resin, a polyamide resin, or an epoxy resin. In addition to such organic materials, a low-dielectric constant material (a low-k material), a siloxane-based resin, PSG (phosphosilicate glass), BPSG (borophosphosilicate glass), or the like can be used. Further alternatively, the planarization insulating layer can be a stack of a plurality of insulating layers formed using any of these materials.

Furthermore, after the transistor 420 is formed, heat treatment may be performed in the air at a temperature higher than or equal to 100° C. and lower than or equal to 400° C. This heat treatment may be performed at a fixed heating temperature; alternatively, the following change in the heating temperature may be conducted plural times: the heating temperature is increased from room temperature to a temperature higher than or equal to 100° C. and lower than or equal to 400° C. and then decreased to room temperature. This heat treatment may be performed under a reduced pressure. The heat treatment time can be shortened under the reduced pressure. By this heat treatment, oxygen contained in the insulating layer 417a can be supplied to the oxide semiconductor layer 403, so that the reliability of the semiconductor device can be improved.

Figure 3A:
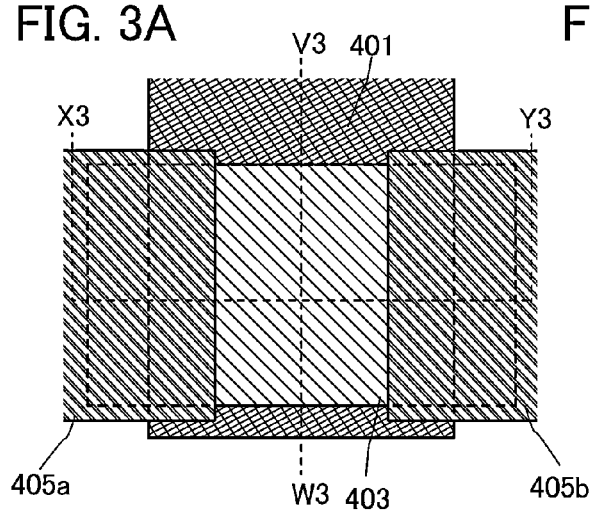
FIGS. 3A to 3C are a plan view and cross-sectional views illustrating one embodiment of a semiconductor device.
Figure 3C:
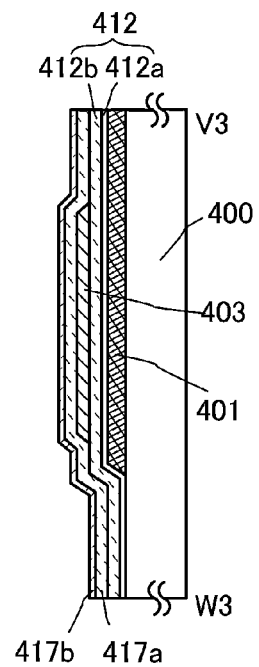
Figure 3B:
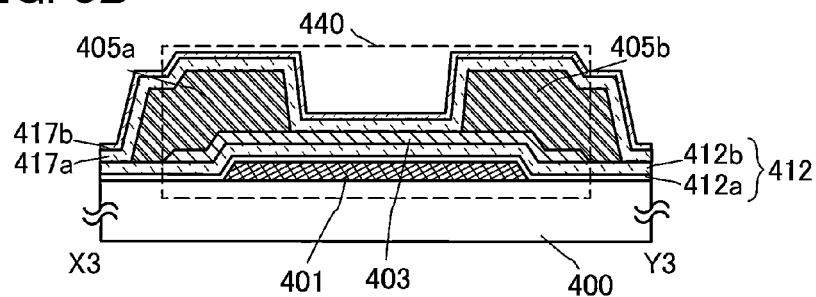

FIGS. 3A to 3C illustrate another structure example of a transistor of this embodiment.

FIG. 3A is a plan view of a transistor 440. FIG. 3B is a cross-sectional view taken along line X3-Y3 in FIG. 3A. FIG. 3C is a cross-sectional view taken along line V3-W3 in FIG. 3A. Note that in FIG. 3A, some components of the transistor 440 (e.g., the aluminum oxide film 417b and the like) are not illustrated in order to avoid complexity.

The transistor 440 illustrated in FIGS. 3A to 3C includes the gate electrode layer 401 provided over the substrate 400, a gate insulating layer 412 provided over the gate electrode layer 401, the oxide semiconductor layer 403 overlapping with the gate electrode layer 401 with the gate insulating layer 412 interposed therebetween, the source electrode layer 405a and the drain electrode layer 405b which are electrically connected to the oxide semiconductor layer 403, the insulating layer 417a which covers the source electrode layer 405a and the drain electrode layer 405b and is in contact with the oxide semiconductor layer 403, and the aluminum oxide film 417b provided over the insulating layer 417a.

In the transistor 440, the gate insulating layer 412 in contact with the oxide semiconductor layer 403 is an insulating layer including a region where oxygen is contained in excess of the stoichiometric composition due to oxygen doping treatment. Specifically, in the gate insulating layer 412 having a stacked structure, at least a gate insulating layer 412b in contact with the oxide semiconductor layer 403 is an insulating layer including a region which contains oxygen in excess of the stoichiometric composition. Note that a gate insulating layer 412a does not necessarily include an oxygen excess region. However, by oxygen doping treatment on the gate insulating layer 412b, the gate insulating layer 412a may be a film including an oxygen excess region, like the gate insulating layer 412b. A step for doping the gate insulating layer 412a with oxygen may be additionally performed.

The details of the oxygen doping treatment on the gate insulating layer 412 are the same as those of the above-described step of introducing the oxygen 454. Note that the oxygen doping treatment on the gate insulating layer 412 is preferably performed after heat treatment for removing hydrogen atoms in the gate insulating layer 412. Addition of oxygen, which is performed after heat treatment, can compensate for oxygen which may be released from the layer by the heat treatment.

Note that the gate insulating layer 412 may be subjected to heat treatment and/or oxygen doping treatment plural times.

Oxygen contained excessively in the gate insulating layer 412 is supplied to the oxide semiconductor layer 403 in contact with the gate insulating layer 412 by heat treatment (corresponding to heating the substrate 400 at the time of depositing the oxide semiconductor layer, the deposition temperature of the insulating layer, or the like, for example) performed in the process for manufacturing a transistor. Thus, in the transistor 440, an oxygen excess region is formed at the interface between the gate insulating layer 412 and the oxide semiconductor layer 403 or at least in part of the oxide semiconductor layer 403 (a bulk). Note that a heating step for supplying oxygen from the gate insulating layer 412 to the oxide semiconductor layer 403 may be performed.

The structure and the manufacturing method of the transistor 420 can be referred to for details of those of the transistor 440.

In the semiconductor device described in this embodiment, an insulating layer provided in contact with the upper surface of the oxide semiconductor layer 403 or insulating layers provided in contact with the upper surface and the lower surface of the oxide semiconductor layer 403 are each a layer including an oxygen excess region formed by being subjected to oxygen doping treatment. Each of the above insulating layers is a film from which impurities such as water or hydrogen are removed as much as possible by dehydration or dehydrogenation treatment. The insulating layer in which the content of water and hydrogen is reduced and the content of oxygen is increased is formed in contact with the oxide semiconductor layer 403, whereby entry of water and hydrogen into the oxide semiconductor layer 403 can be suppressed, and oxygen can be supplied to the oxide semiconductor layer 403.

Thus, an oxygen excess region can be formed in the oxide semiconductor layer 403 and/or at the interface between the oxide semiconductor layer 403 and the insulating layer. With such a structure, the density of oxygen vacancies in the oxide semiconductor layer, which cause a shift of the threshold voltage in the negative direction, can be reduced; accordingly, fluctuation in the threshold voltage of the transistor can be reduced and a normally-off transistor can be obtained. In addition, the sub-threshold value (S value) of the transistor can be reduced.

Further, in the semiconductor device described in this embodiment, oxygen doping treatment is performed on the insulating layer in contact with the oxide semiconductor layer 403; thus, film quality and/or crystallinity of the oxide semiconductor layer 403 can be more improved than the case where oxygen doping treatment is performed directly on the oxide semiconductor layer 403. In particular, when the oxide semiconductor layer 403 is a CAAC-OS film, crystallinity of the CAAC-OS film might be degraded due to oxygen doping treatment performed on the CAAC-OS film. Therefore, it is effective to employ a method for manufacturing a semiconductor device described in this embodiment.

The methods and structures described in this embodiment can be combined as appropriate with any of the methods and structures described in the other embodiments.

Embodiment 2

A semiconductor device having a display function (also referred to as a display device) can be manufactured using the transistor described in Embodiment 1. Further, part or all of the driver circuits which include the transistor can be formed over a substrate where a pixel portion is formed, whereby a system-on-panel can be formed.

Figure 4A:
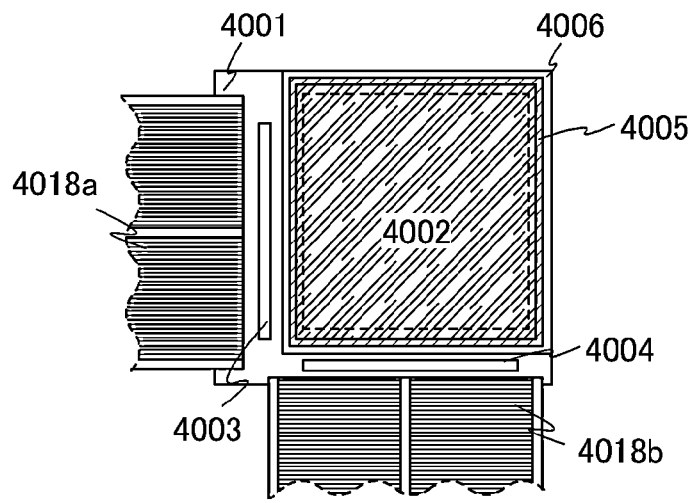
FIGS. 4A to 4C are plan views illustrating embodiments of a semiconductor device.

In FIG. 4A, a sealant 4005 is provided so as to surround a pixel portion 4002 provided over a substrate 4001, and the pixel portion 4002 is sealed by the sealant 4005 and a substrate 4006. In FIG. 4A, a scan line driver circuit 4004 and a signal line driver circuit 4003 which are each formed using a single crystal semiconductor film or a polycrystalline semiconductor film over an IC chip or a substrate separately prepared are mounted on the substrate 4001, in a region that is different from the region surrounded by the sealant 4005. A variety of signals and potentials are supplied to the signal line driver circuit 4003 and the scan line driver circuit 4004 each of which is separately formed, and the pixel portion 4002 from flexible printed circuits (FPCs) 4018a and 4018b.

Figure 4B:
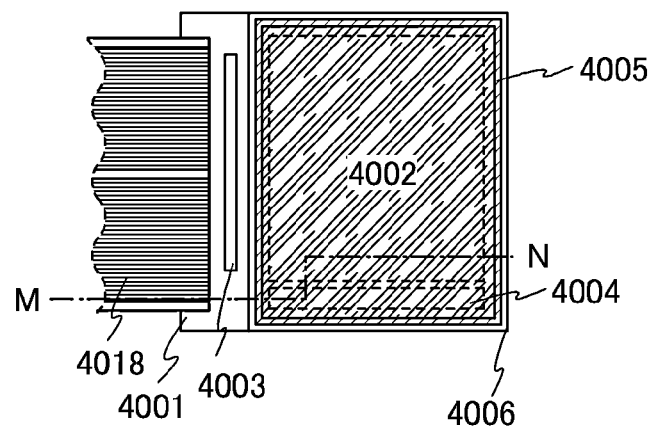
Figure 4C:
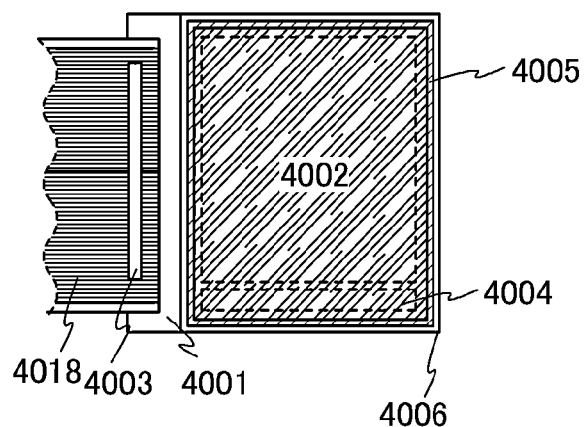

In FIGS. 4B and 4C, the sealant 4005 is provided so as to surround the pixel portion 4002 and the scan line driver circuit 4004 which are provided over the substrate 4001. The substrate 4006 is provided over the pixel portion 4002 and the scan line driver circuit 4004. Consequently, the pixel portion 4002 and the scan line driver circuit 4004 are sealed together with a display element, by the substrate 4001, the sealant 4005, and the substrate 4006. In FIGS. 4B and 4C, the signal line driver circuit 4003 which is formed using a single crystal semiconductor film or a polycrystalline semiconductor film over an IC chip or a substrate separately prepared is mounted on the substrate 4001, in a region that is different from the region surrounded by the sealant 4005. In FIGS. 4B and 4C, a variety of signals and potentials are supplied to the signal line driver circuit 4003 that is separately formed, the scan line driver circuit 4004, and the pixel portion 4002 from a FPC 4018.

Although FIGS. 4B and 4C each illustrate an example in which the signal line driver circuit 4003 is formed separately and mounted on the substrate 4001, one embodiment of the present invention is not limited to this structure. The scan line driver circuit may be separately formed and then mounted, or only part of the signal line driver circuit or part of the scan line driver circuit may be separately formed and then mounted.

A connection method of a separately formed driver circuit is not particularly limited; a chip on glass (COG) method, a wire bonding method, a tape carrier package (TCP) method, or the like can be used. FIG. 4A illustrates an example in which the signal line driver circuit 4003 and the scan line driver circuit 4004 are mounted by a COG method. FIG. 4B illustrates an example in which the signal line driver circuit 4003 is mounted by a COG method. FIG. 4C illustrates an example in which the signal line driver circuit 4003 is mounted by a TCP method.

The display device includes, in its category, a panel in which a display element is sealed, and a module in which an IC or the like including a controller is mounted on the panel.

Note that a display device in this specification means an image display device, a display device, or a light source (including a lighting device). Further, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the substrate include a plurality of transistors, and the transistor described in Embodiment 1 can be applied thereto.

As the display element provided in the display device, a liquid crystal element (also referred to as a liquid crystal display element) or a light-emitting element (also referred to as a light-emitting display element) can be used. The light-emitting element includes an element whose luminance is controlled by current or voltage in its category, and specifically includes an inorganic electroluminescent (EL) element, an organic EL element, and the like. Furthermore, a display medium whose contrast is changed by an electric effect, such as electronic ink, can be used.

Figure 6A:
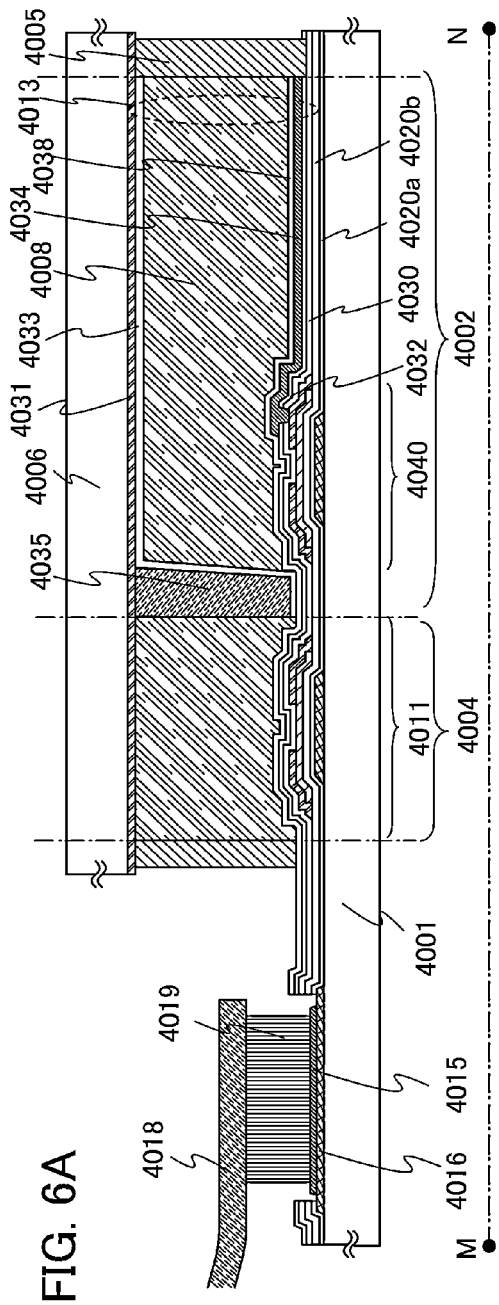
FIGS. 6A and 6B are cross-sectional views each illustrating one embodiment of a semiconductor device.
Figure 6B:
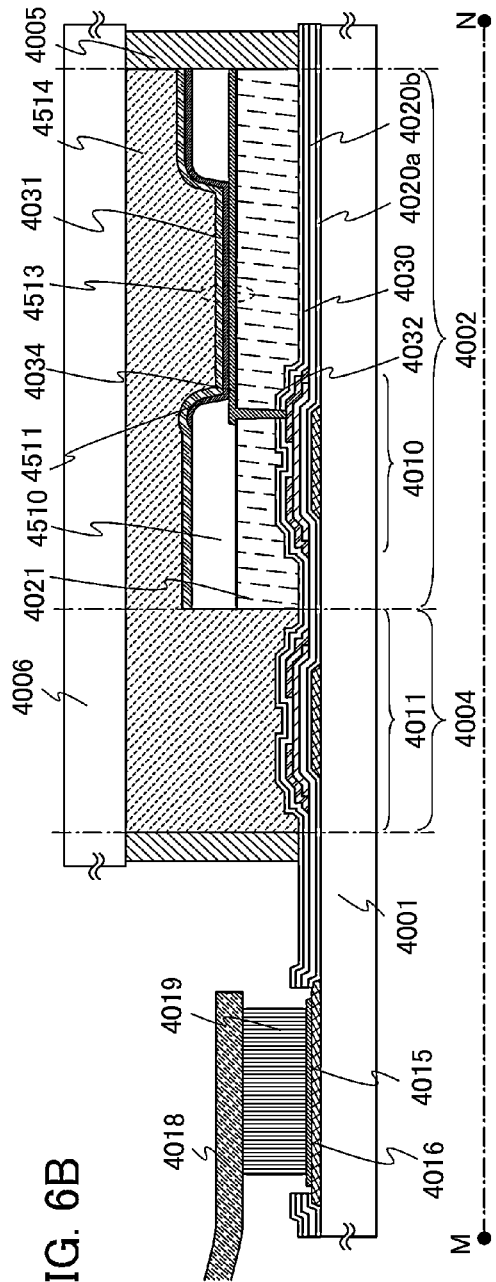

Embodiments of the semiconductor device will be described with reference to FIGS. 4A to 4C, FIGS. 5A and 5B, and FIGS. 6A and 6B. FIGS. 6A and 6B correspond to the cross-sectional view taken along line M-N in FIG. 4B.

As illustrated in FIGS. 4A to 4C and FIGS. 6A and 6B, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive layer 4019.

The connection terminal electrode 4015 is formed from the same conductive layer as a first electrode layer 4034. The terminal electrode 4016 is formed from the same conductive layer as a source electrode layer and a drain electrode layer of transistors 4040, 4010, and 4011.

The pixel portion 4002 and the scan line driver circuit 4004 provided over the substrate 4001 include a plurality of transistors. FIG. 6A illustrates the transistor 4040 included in the pixel portion 4002 and the transistor 4011 included in the scan line driver circuit 4004, as an example. In FIG. 6A, insulating layers 4030 and 4032 are provided over the transistors 4040 and 4011, and in FIG. 6B, an insulating layer 4021 is further provided in addition to the insulating layers 4030 and 4032.

The transistor described in Embodiment 1 can be applied to the transistor 4040, the transistor 4010, and the transistor 4011. This embodiment shows an example in which a transistor having a structure similar to that of the transistor 420 described in Embodiment 1 is used. The transistors 4040, 4010, and 4011 are bottom-gate transistors.

In each of the transistors 4040, 4010, and 4011, an insulating layer in which an oxygen excess region is formed by oxygen doping treatment is included as the insulating layer 4030 which is in contact with an oxide semiconductor layer, and an aluminum oxide film which is formed by oxidation of an aluminum film due to the oxygen doping treatment is included as the insulating layer 4032 provided over and in contact with the insulating layer 4030. Thus, into the oxide semiconductor layer, impurities such as hydrogen or water, which causes a change in characteristics of the transistors 4040, 4010, and 4011, are not included, and oxygen with which oxygen vacancies are filled is supplied. As a result, a change in electric characteristics of the transistors 4040, 4010, and 4011 is suppressed. Further, in the transistors 4040, 4010, and 4011, the aluminum oxide film is formed by oxygen doping treatment performed after deposition of the aluminum film; thus, the transistors 4040, 4010, and 4011 are manufactured with high productivity.

Thus, the semiconductor devices including the transistors 4040, 4010, and 4011 using an oxide semiconductor layer and having stable electrical characteristics, illustrated in FIGS. 4A to 4C and FIGS. 6A and 6B of this embodiment, can have high reliability.

Moreover, a conductive layer may be provided so as to overlap with a channel formation region of the oxide semiconductor layer of the transistor 4011 for the driver circuit. The conductive layer is provided so as to overlap with the channel formation region of the oxide semiconductor layer, whereby the amount of change in the threshold voltage of the transistor 4011 before and after a bias-temperature stress test (a BT test) can be further reduced. The conductive layer may have either the same potential as or a potential different from that of a gate electrode layer of the transistor 4011, and can function as a second gate electrode layer. The potential of the conductive layer may be GND, 0V, or in a floating state.

The conductive layer also has a functions of blocking an external electric field, that is, of preventing an external electric field (particularly, of preventing static electricity) from effecting the inside (a circuit portion including a transistor). A blocking function of the conductive layer can prevent a change in electric characteristics of the transistor due to the effect of external electric field such as static electricity.

Each of the transistors 4040 and 4010 included in the pixel portion 4002 is electrically connected to a display element to form a display panel. There is no particular limitation on the kind of the display element as long as display can be performed, and various kinds of display elements can be employed.

An example of a liquid crystal display device using a liquid crystal element as a display element is shown in FIG. 6A. In FIG. 6A, a liquid crystal element 4013 which is a display element includes a first electrode layer 4034, a second electrode layer 4031, and a liquid crystal layer 4008. Note that insulating layers 4033 and 4038 functioning as alignment films are provided so that the liquid crystal layer 4008 is interposed therebetween. The second electrode layer 4031 is provided on the substrate 4006 side, and the first electrode layer 4034 and the second electrode layer 4031 are stacked with the liquid crystal layer 4008 provided therebetween.

A columnar spacer denoted by reference numeral 4035 is obtained by selective etching of an insulating layer and is provided in order to adjust the thickness of the liquid crystal layer 4008 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In this case, the liquid crystal layer 4008 is in contact with the first electrode layer 4034 and the second electrode layer 4031. A blue phase is one of liquid crystal phases, which is generated just before a cholesteric phase changes into an isotropic phase while temperature of cholesteric liquid crystal is increased. The blue phase can be exhibited using a liquid crystal composition which is a mixture of a liquid crystal and a chiral agent. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor including an oxide semiconductor layer particularly has a possibility that electric characteristics of the transistor may fluctuate significantly by the influence of static electricity and deviate from the designed range. Therefore, it is more effective to use a liquid crystal composition exhibiting a blue phase for the liquid crystal display device including the transistor including an oxide semiconductor layer.

The specific resistivity of the liquid crystal material is greater than or equal to $1 \times 10^9$ Ω·cm, preferably greater than or equal to $1 \times 10^{11}$ Ω·cm, further preferably greater than or equal to $1 \times 10^{12}$ Ω·cm. Note that the specific resistivity in this specification is measured at 20° C.

The size of storage capacitor formed in the liquid crystal display device is set considering the leakage current of the transistor provided in the pixel portion or the like so that charge can be held for a predetermined period. The size of the storage capacitor may be set considering the off-state current of a transistor or the like. By using a transistor including an oxide semiconductor layer, which is disclosed in this specification, it is enough to provide a storage capacitor having a capacitance that is ⅓ or less, preferably ⅕ or less of liquid crystal capacitance of each pixel.

In the transistor including an oxide semiconductor layer, which is disclosed in this specification, the amount of current in an off state (off-state current) can be made small. Accordingly, an electric signal such as an image signal can be held for a longer period in the pixel, and a writing interval can be set longer in an on state. Accordingly, frequency of refresh operation can be reduced, which leads to an effect of suppressing power consumption.

The transistor including an oxide semiconductor layer, which is disclosed in this specification, can have relatively high field-effect mobility; thus, the driver circuit can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed using a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. Some examples are given as the vertical alignment mode. For example, a multi-domain vertical alignment (MVA) mode, a patterned vertical alignment (PVA) mode, an Advanced Super View (ASV) mode, and the like can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a method for display in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an organic EL element is used as a light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is necessary that at least one of a pair of electrodes has a light-transmitting property. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and any of these emission structures can be used.

FIGS. 5A and 5B and FIG. 6B illustrate examples of a light-emitting device including a light-emitting element as a display element.

FIG. 5A is a plan view of a light-emitting device, and FIG. 5B is a cross-sectional view taken along dashed-dotted lines S1-T1, S2-T2, and S3-T3 in FIG. 5A. Note that, an electroluminescent layer 542 and a second electrode layer 543 are not illustrated in the plan view in FIG. 5A.

The light-emitting device illustrated in FIGS. 5A and 5B includes, over a substrate 500, a transistor 510, a capacitor 520, and an intersection 530 of wiring layers. The transistor 510 is electrically connected to a light-emitting element 540. Note that FIGS. 5A and 5B illustrate a bottom-emission light-emitting device in which light from the light-emitting element 540 is extracted through the substrate 500.

The transistor described in Embodiment 1 can be applied to the transistor 510. This embodiment shows an example in which a transistor having a structure similar to that of the transistor 420 described in Embodiment 1 is used. The transistor 510 is a bottom-gate transistor.

The transistor 510 includes gate electrode layers 511a and 511b, a gate insulating layer 502, an oxide semiconductor layer 512, and conductive layers 513a and 513b functioning as a source electrode layer and a drain electrode layer.

In the transistor 510, an insulating layer in which an oxygen excess region is formed by oxygen doping treatment is included as the insulating layer 524 which is in contact with the oxide semiconductor layer 512, and an aluminum oxide film which is formed by oxidation of an aluminum film due to the above oxygen doping treatment is included as an insulating layer 525 which over and is in contact with the insulating layer 524. Thus, into the oxide semiconductor layer 512, impurities such as hydrogen or water, which causes a change in characteristics of the transistor 510, are not included, and oxygen with which oxygen vacancies are filled is supplied. As a result, a change in electric characteristics of the transistor 510 is suppressed. Further, in the transistor 510, the aluminum oxide film is formed by oxygen doping treatment performed after deposition of the aluminum film; thus, the transistor 510 is manufactured with high productivity.

Thus, the semiconductor device including the transistor 510 using the oxide semiconductor layer 512 and having stable electrical characteristics, illustrated in FIGS. 5A and 5B of this embodiment, can have high reliability. Further, such a highly reliable semiconductor device can be manufactured with a high yield, so that high productivity can be achieved.

The capacitor 520 includes conductive layers 521a and 521b, the gate insulating layer 502, an oxide semiconductor layer 522, and a conductive layer 523. The gate insulating layer 502 and the oxide semiconductor layer 522 are sandwiched between the conductive layer 523 and the conductive layers 521a and 521b, whereby the capacitor is formed.

The intersection 530 of wiring layers is an intersection of a conductive layer 533 and the gate electrode layers 511a and 511b. The conductive layer 533 and the gate electrode layers 511a and 511b intersect with each other with the gate insulating layer 502 provided therebetween.

In this embodiment, a 30-nm-thick titanium film is used as the gate electrode layer 511a and the conductive layer 521a, and a 200-nm-thick copper thin film is used as the gate electrode layer 511b and the conductive layer 521b. Thus, the gate electrode layer has a stacked-layer structure of a titanium film and a copper thin film.

A 25-nm-thick IGZO film is used as the oxide semiconductor layers 512 and 522.

An interlayer insulating layer 504 is formed over the transistor 510, the capacitor 520, and the intersection 530 of wiring layers. Over the interlayer insulating layer 504, a color filter layer 505 is provided in a region overlapping with the light-emitting element 540. An insulating layer 506 functioning as a planarization insulating layer is provided over the interlayer insulating layer 504 and the color filter layer 505.

The light-emitting element 540 having a stacked-layer structure in which a first electrode layer 541, the electroluminescent layer 542, and the second electrode layer 543 are stacked in that order is provided over the insulating layer 506. The first electrode layer 541 and the conductive layer 513a are in contact with each other in an opening formed in the insulating layer 506 and the interlayer insulating layer 504, which reaches the conductive layer 513a; thus the light-emitting element 540 and the transistor 510 are electrically connected to each other. Note that a partition 507 is provided so as to cover part of the first electrode layer 541 and the opening.

Further, a photosensitive acrylic film having a thickness of 1500 nm and a photosensitive polyimide film having a thickness of 1500 nm can be used as the insulating layer 506 and the partition 507, respectively.

As the color filter layer 505, for example, a chromatic light-transmitting resin can be used. As the chromatic color light-transmitting resin, a photosensitive organic resin or a non-photosensitive organic resin can be used. The photosensitive organic resin is preferably used, in which case the number of resist masks can be reduced, which results in simplification of the process.

Chromatic colors are all colors except achromatic colors such as black, gray, and white. The color filter layer is formed using a material which transmits only light of any of chromatic colors. As chromatic color, red, green, blue, or the like can be used. Alternatively, cyan, magenta, yellow, or the like may also be used. "Transmitting only light of a chromatic color" means that light passing through the color filter layer has a peak at a wavelength of the light of the chromatic color. The thickness of the color filter layer may be adjusted as appropriate in consideration of the relationship between the concentration of the coloring material to be included and the transmittance of light. For example, the color filter layer 505 may have a thickness greater than or equal to 1500 nm and less than or equal to 2000 nm.

In the light-emitting device illustrated in FIG. 6B, a light-emitting element 4513 which is a display element is electrically connected to the transistor 4010 provided in the pixel portion 4002. The light-emitting element 4513 has a stacked-layer structure of the first electrode layer 4034, an electroluminescent layer 4511, and the second electrode layer 4031 but is not limited to this structure. The structure of the light-emitting element 4513 can be changed as appropriate depending on a direction in which light is extracted from the light-emitting element 4513, or the like.

Partitions 4510 and 507 can be formed using an organic insulating material or an inorganic insulating material. It is particularly preferable that the partitions 4510 and 507 be formed using a photosensitive resin material to have openings over the first electrode layers 4034 and 541, respectively. A sidewall of each opening is formed as a tilted surface with continuous curvature.

The electroluminescent layers 4511 and 542 may be formed using either a single layer or a plurality of layers stacked.

A protective film may be formed over the second electrode layer 4031 and the partition 4510 and over the second electrode layer 543 and the partition 507 in order to prevent entry of oxygen, hydrogen, moisture, carbon dioxide, or the like into the light-emitting elements 4513 and 540. As the protective film, a silicon nitride film, a silicon nitride oxide film, a DLC film, or the like can be formed.

Further, the light-emitting elements 4513 and 540 may be covered with respective layers containing an organic compound deposited by an evaporation method so that oxygen, hydrogen, moisture, carbon dioxide, or the like do not enter the light-emitting elements 4513 and 540.

In addition, in a space which is formed with the substrate 4001, the substrate 4006, and the sealant 4005, a filler 4514 is provided and sealed. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), an acrylic resin, a polyimide resin, an epoxy resin, a silicone resin, polyvinyl butyral (PVB), or ethylene vinyl acetate (EVA) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 4A to 4C, FIGS. 5A and 5B, and FIGS. 6A and 6B, a flexible substrate as well as a glass substrate can be used as any of the substrates 4001 and 500 and the substrate 4006. For example, a light-emitting plastic substrate, or the like can be used. As plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is interposed between PVF films or polyester films can be used.

In this embodiment, as the gate insulating layer 4020a, a silicon nitride film is used. As the gate insulating layer 4020b and the insulating layer 4030 which are in contact with the oxide semiconductor layer, a silicon oxynitride film formed by a plasma CVD method is used. The silicon oxynitride film is subjected to heat treatment for dehydration or dehydrogenation and oxygen doping treatment. Further, the insulating layer 4032 is provided over the insulating layer 4030. In this embodiment, as the insulating layer 4032, an aluminum oxide film which is obtained by oxidation of an aluminum film due to oxygen doping treatment is used.

The aluminum oxide film has a high blocking effect of preventing penetration of both oxygen and impurities such as hydrogen or moisture.

Therefore, in and after the manufacturing process, the aluminum oxide film functions as a protective film for preventing entry of impurities such as hydrogen or moisture, which cause a change in electric characteristics of the transistor, and release of oxygen into/from the silicon oxynitride film which has been subjected to the heat treatment for dehydration or dehydrogenation and the oxygen doping treatment.

The insulating layers 4021 and 506 functioning as a planarization insulating layer can be formed using an organic material having heat resistance, such as an acrylic resin, a polyimide resin, a benzocyclobutene-based resin, a polyamide resin, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the insulating layer may be formed by stacking a plurality of insulating layers formed of any of these materials.

There is no particular limitation on the method for forming the insulating layers 4021 and 506, and the following method or tool (equipment) can be used depending on the material: a sputtering method, spin coating, dipping, spray coating, a droplet discharge method (such as an ink-jet method), a printing method (such as screen printing or offset printing), a doctor knife, a roll coater, a curtain coater, a knife coater, or the like.

The display device displays an image by transmitting light from a light source or a display element. Therefore, the substrate and the thin films such as the insulating layer and the conductive layer provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layers 4034 and 541 and the second electrode layers 4031 and 543 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

Alternatively, the first electrode layers 4034 and 541 and the second electrode layers 4031 and 543 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

In this embodiment, since the light-emitting device illustrated in FIGS. 5A and 5B has a bottom-emission structure, the first electrode layer 541 has a light-transmitting property and the second electrode layer 543 has a light-reflecting property. Accordingly, in the case of using a metal film as the first electrode layer 541, the film is preferably thin enough to keep the light-transmitting property; on the other hand, in the case of using a light-transmitting conductive film as the second electrode layer 543, a conductive layer having a light-reflecting property is preferably stacked thereon.

A conductive composition containing a conductive high molecule (also referred to as a conductive polymer) can be used for the first electrode layers 4034 and 541 and the second electrode layers 4031 and 543. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protective circuit for protecting the driver circuit is preferably provided. The protective circuit is preferably formed using a nonlinear element.

By using the transistor described in Embodiment 1 as described above, the semiconductor device can have a variety of functions.

The structures, methods, and the like described in this embodiment can be combined as appropriate with any of the structures, methods, and the like described in the other embodiments.

Embodiment 3

A semiconductor device having an image sensor function of reading data on an object can be manufactured using the transistors described in Embodiment 1.

Figure 7A:
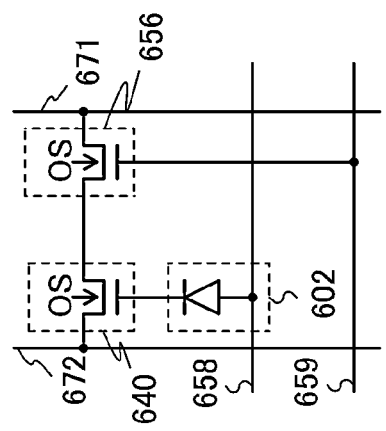
FIGS. 7A and 7B are a circuit diagram and a cross-sectional view, respectively, illustrating one embodiment of a semiconductor device.

An example of a semiconductor device having an image sensor function is shown in FIG. 7A. FIG. 7A shows an equivalent circuit of a photo sensor, and FIG. 7B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor using an oxide semiconductor layer is denoted by a symbol "OS" so that it can be identified as a transistor including an oxide semiconductor layer. In FIG. 7A, the transistor 640 and the transistor 656 are each a transistor using an oxide semiconductor layer, to which the transistor described in Embodiment 1 can be applied. This embodiment shows an example in which a transistor having a structure similar to that of the transistor 420 described in Embodiment 1 is used. The transistor 640 is a bottom-gate transistor.

Figure 7B:
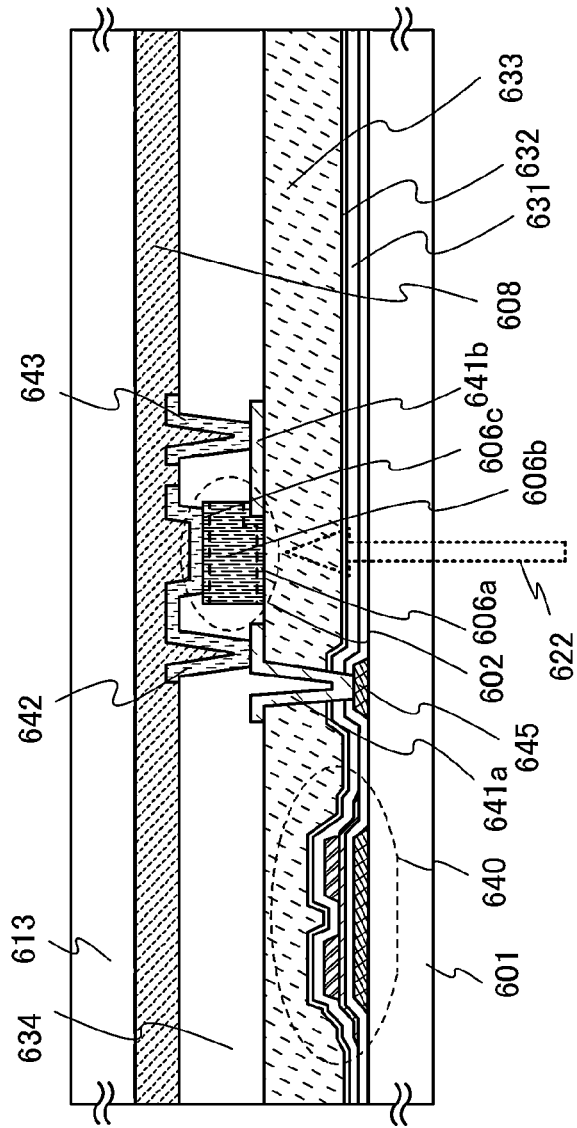

FIG. 7B is a cross-sectional view illustrating the photodiode 602 and the transistor 640 in the photo sensor. The photodiode 602 functioning as a sensor and the transistor 640 are provided over a substrate 601 (element substrate) having an insulating surface. A substrate 613 is provided over the photodiode 602 and the transistor 640 with an adhesive layer 608 interposed therebetween.

An insulating layer 631, an insulating layer 632, an interlayer insulating layer 633, and an interlayer insulating layer 634 are provided over the transistor 640. The photodiode 602 includes an electrode layer 641b formed over the interlayer insulating layer 633, semiconductor films (a first semiconductor film 606a, a second semiconductor film 606b, and a third semiconductor film 606c stacked over the electrode layer 641b in this order), an electrode layer 642 which is provided over the interlayer insulating layer 634 and electrically connected to the electrode layer 641b through the first to third semiconductor films, and an electrode layer 641a which is provided in the same layer as the electrode layer 641b and electrically connected to the electrode layer 642.

The electrode layer 641b is electrically connected to a conductive layer 643 formed over the interlayer insulating layer 634, and the electrode layer 642 is electrically connected to a conductive layer 645 through the electrode layer 641a. The conductive layer 645 is electrically connected to a gate electrode layer of the transistor 640, and the photodiode 602 is electrically connected to the transistor 640.

Here, a pin photodiode in which a semiconductor film having p-type conductivity type as the first semiconductor film 606a, a high-resistance semiconductor film (i-type semiconductor film) as the second semiconductor film 606b, and a semiconductor film having n-type conductivity type as the third semiconductor film 606c are stacked is illustrated as an example.

The first semiconductor film 606a is a p-type semiconductor film and can be formed using an amorphous silicon film containing an impurity element imparting p-type conductivity type. The first semiconductor film 606a is formed by a plasma CVD method with use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion injecting method or the like in order to diffuse the impurity element. In this case, as a method for forming the amorphous silicon film, an LPCVD method, a chemical vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity type. The third semiconductor film 606c is formed by a plasma CVD method with use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion injecting method or the like in order to diffuse the impurity element. In this case, as a method for forming the amorphous silicon film, an LPCVD method, a chemical vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

In addition, the mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having the conductivity type opposite to that of the semiconductor film on the light-receiving plane is disturbance light; therefore, the electrode layer is preferably formed using a light-blocking conductive layer. Note that the n-type semiconductor film side may alternatively be a light-receiving plane.

The insulating layer 631, the insulating layer 632, the interlayer insulating layer 633, and the interlayer insulating layer 634 can be formed using an insulating material by a sputtering method, a plasma CVD method, spin coating, dipping, spray coating, a droplet discharge method (such as an inkjet method), a printing method (such as screen printing or offset printing), or the like depending on the material.

The insulating layer 631 can be formed using an inorganic insulating material to have a single layer or a stacked layer of a silicon oxynitride layer, a silicon nitride oxide layer or the like, for example.

In this embodiment, as the insulating layer 631, a silicon oxynitride film formed by a plasma CVD method is used and subjected to heat treatment for dehydration or dehydrogenation.

In addition, an aluminum film is formed over the silicon oxynitride film subjected to heat treatment for dehydration or dehydrogenation, and oxygen doping treatment is performed on the silicon oxynitride film and the aluminum film. By this oxygen doping treatment, a silicon oxide film including an oxygen excess region and an aluminum oxide film obtained by oxidation of the aluminum film are formed. In this embodiment, the insulating layer 632 is provided over the insulating layer 631, and the aluminum oxide film is used as the insulating layer 632.

The aluminum oxide film has a high blocking effect of preventing penetration of both oxygen and impurities such as hydrogen or moisture.

Therefore, in and after the manufacturing process, the aluminum oxide film functions as a protective film for preventing entry of impurities such as hydrogen or moisture, which cause a change in electric characteristics of the transistor, and release of oxygen into/from the silicon oxynitride film which has been subjected to the heat treatment for dehydration or dehydrogenation and the oxygen doping treatment.

For reduction of surface roughness, an insulating layer functioning as a planarization insulating layer is preferably used as each of the interlayer insulating layers 633 and 634.

With detection of light that enters the photodiode 602, data on an object to be detected can be read. Note that a light source such as a backlight can be used at the time of reading data on an object.

In the transistor 640, an insulating layer in which an oxygen excess region is formed by oxygen doping treatment is used as the insulating layer 631 in contact with the oxide semiconductor layer. Thus, oxygen with which oxygen vacancies of the transistor 640 are filled is supplied to the oxide semiconductor layer. As a result, a change in electric characteristics of the transistor 640 is suppressed.

Therefore, a highly reliable semiconductor device including the transistor 640 of this embodiment, which includes the oxide semiconductor layer and has stable electric characteristics, can be provided. Further, such a highly reliable semiconductor device can be manufactured with a high yield, so that high productivity can be achieved.

The structures, methods, and the like described in this embodiment can be combined as appropriate with any of the structures, methods, and the like described in the other embodiments.

Embodiment 4

A semiconductor device disclosed in this specification can be applied to a variety of electronic devices (including game machines). Examples of electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of such electronic devices are illustrated in FIGS. 8A to 8C and FIGS. 9A to 9C.

Figure 8A:
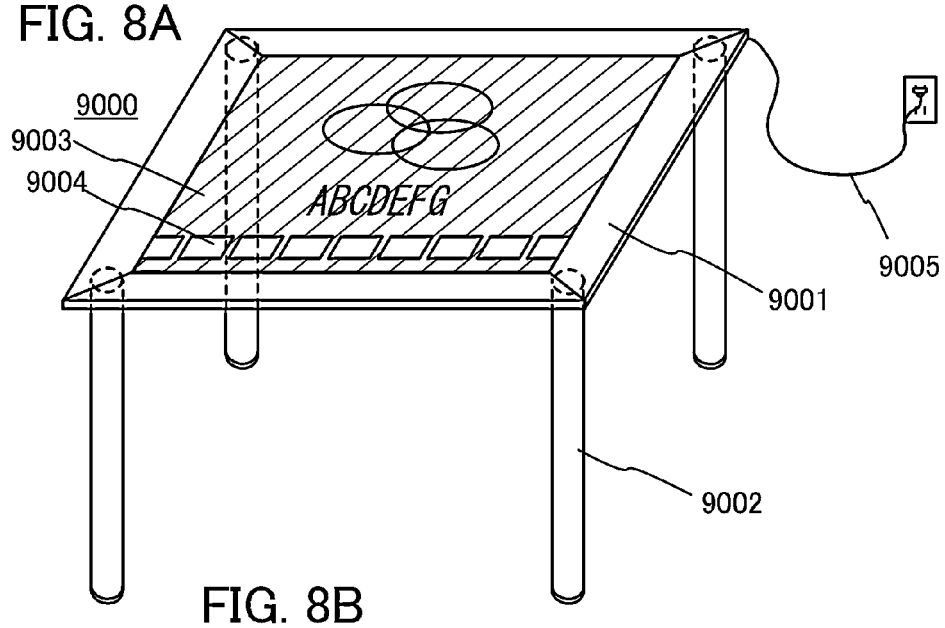
FIGS. 8A to 8C illustrate electronic devices.

FIG. 8A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of the above embodiments can be used for the display portion 9003, so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, with use of the semiconductor device having an image sensor described in Embodiment 3, the display portion 9003 can function as a touch panel.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

Figure 8B:
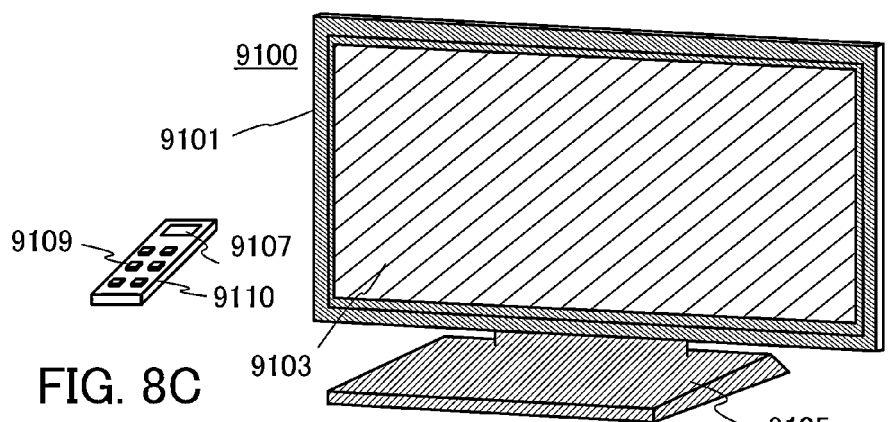

FIG. 8B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled.

Furthermore, the remote controller 9110 may be provided with a display portion 9107 for displaying data output from the remote controller 9110.

The television set 9100 illustrated in FIG. 8B is provided with a receiver, a modem, and the like. With use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

The semiconductor device described in any of the above embodiments can be used in the display portions 9103 and 9107, so that the television set and the remote controller can have high reliability.

Figure 8C:
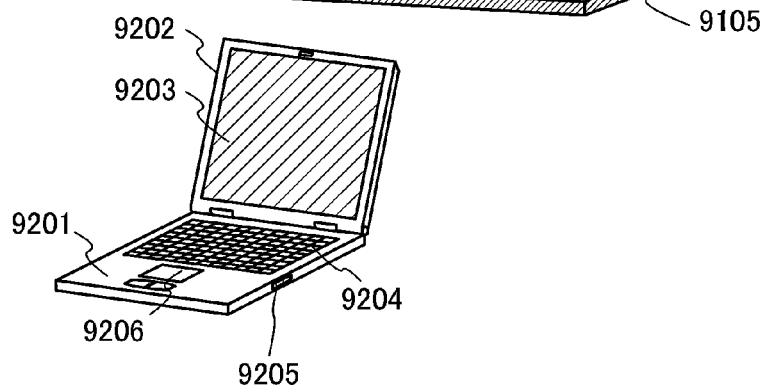

FIG. 8C illustrates a computer which includes a main body 9201, a housing 9202, a display portion 9203, a keyboard 9204, an external connection port 9205, a pointing device 9206, and the like.

The semiconductor device described in any of the above embodiments can be used for the display portion 9203, so that the computer can have high reliability.

FIGS. 9A and 9B illustrate a tablet terminal that can be folded. In FIG. 9A, the tablet terminal is opened, and includes a housing 9630, a display portion 9631*a*, a display portion 9631*b*, a display-mode switching button 9034, a power button 9035, a power-saving-mode switching button 9036, a clip 9033, and an operation button 9038.

The semiconductor device described in any of the above embodiments can be used for the display portion 9631*a* and the display portion 9631*b*, so that the tablet terminal can have high reliability.

Part of the display portion 9631*a* can be a touch panel region 9632*a* and data can be input when a displayed operation key 9638 is touched. Note that FIG. 9A shows, as an example, that half of the area of the display portion 9631*a* has only a display function and the other half of the area has a touch panel function. However, the structure of the display portion 9631*a* is not limited to this, and all the area of the display portion 9631*a* may have a touch panel function. For example, all the area of the display portion 9631*a* can display keyboard buttons and serve as a touch panel while the display portion 9631*b* can be used as a display screen.

Like the display portion 9631*a*, part of the display portion 9631*b* can be a touch panel region 9632*b*. When a finger, a stylus, or the like touches the place where a button 9639 for switching to keyboard display is displayed in the touch panel, keyboard buttons can be displayed on the display portion 9631*b*.

Touch input can be performed concurrently on the touch panel regions 9632*a* and 9632*b*.

The display-mode switching button 9034 allows switching between a landscape mode and a portrait mode, color display and black-and-white display, and the like. With the power-saving-mode switching button 9036, the luminance of display can be optimized in accordance with the amount of external light at the time when the tablet terminal is in use, which is detected with an optical sensor incorporated in the tablet. The tablet terminal may include another detection device such as a sensor for detecting orientation (e.g., a gyroscope or an acceleration sensor) in addition to the optical sensor.

Although the display portion 9631*a* and the display portion 9631*b* have the same display size in FIG. 9A, an embodiment of the present invention is not limited to this example. The display portion 9631*a* and the display portion 9631*b* may have different sizes or different display quality. For example, one of them may be a display panel that can display higher-definition images than the other.

FIG. 9B illustrates the tablet terminal folded, which includes the housing 9630, a solar battery 9633, and a charge and discharge control circuit 9634. Note that FIG. 9B shows an example in which the charge and discharge control circuit 9634 includes a battery 9635 and a DCDC converter 9636.

Since the tablet terminal can be folded in two, the housing 9630 can be closed when the tablet terminal is not in use. Thus, the display portions 9631*a* and 9631*b* can be protected, thereby providing a tablet terminal with high endurance and high reliability for long-term use.

The tablet terminal illustrated in FIGS. 9A and 9B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar battery 9633, which is attached on the surface of the tablet terminal, supplies electric power to a touch panel, a display portion, an image signal processor, and the like. The solar battery 9633 can be provided on one or both surfaces of the housing 9630, so that the battery 9635 can be charged efficiently. When a lithium ion battery is used as the battery 9635, there is an advantage of downsizing or the like.

The structure and operation of the charge and discharge control circuit 9634 illustrated in FIG. 9B are described with reference to a block diagram of FIG. 9C. FIG. 9C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 9B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

The structures, methods, and the like described in this embodiment can be combined as appropriate with any of the structures, methods, and the like described in the other embodiments.

This application is based on Japanese Patent Application serial no. 2011-278978 filed with Japan Patent Office on Dec. 20, 2012, the entire contents of which are hereby incorporated by reference.

What is claimed is:

1. A method for manufacturing a semiconductor device comprising the steps of:
forming a gate electrode layer;
forming a gate insulating layer over the gate electrode layer;
forming an oxide semiconductor layer overlapping with the gate electrode layer with the gate insulating layer interposed therebetween;
forming a source electrode layer and a drain electrode layer which are electrically connected to the oxide semiconductor layer:
forming an insulating layer over the source electrode layer and the drain electrode layer and in contact with the oxide semiconductor layer;
forming an aluminum film in contact with the insulating layer; and
performing an oxygen doping treatment on the insulating layer and the aluminum film, so that at least a portion of the aluminum film is oxidized to be an aluminum oxide film.

2. The method for manufacturing a semiconductor device according to claim 1, further comprising a step of performing heat treatment on the aluminum film after the step of the performing an oxygen doing treatment.

3. The method for manufacturing a semiconductor device according to claim 1, wherein the aluminum film is oxidized to be an aluminum oxide layer.

4. The method for manufacturing a semiconductor device according to claim 1, wherein the insulating layer comprises an oxygen excess region.

5. The method for manufacturing a semiconductor device according to claim 1, wherein the insulating layer comprises a layer containing nitrogen.

6. The method for manufacturing a semiconductor device according to claim 1, further comprising a step of performing heat treatment on the insulating layer before the aluminum film is formed.

7. The method for manufacturing a semiconductor device according to claim 1, wherein the gate insulating layer comprises an oxygen excess region.

8. The method for manufacturing a semiconductor device according to claim 7, wherein the oxygen excess region is formed by performing an oxygen doping treatment on the gate insulating layer.

9. A method for manufacturing a semiconductor device comprising the steps of:
forming a gate electrode layer;
forming a gate insulating layer over the gate electrode layer;
performing heat treatment on the gate insulating layer to reduce hydrogen in the gate insulating layer;
forming an oxide semiconductor layer overlapping with the gate electrode layer with the gate insulating layer interposed therebetween;
forming a source electrode layer and a drain electrode layer which are electrically connected to the oxide semiconductor layer:
forming an insulating layer over the source electrode layer and the drain electrode layer and in contact with the oxide semiconductor layer;
forming an aluminum film in contact with the insulating layer; and
performing an oxygen doping treatment on the insulating layer and the aluminum film, so that at least a portion of the aluminum film is oxidized to be an aluminum oxide film.

10. The method for manufacturing a semiconductor device according to claim 9, further comprising a step of performing heat treatment on the aluminum film after the step of the performing an oxygen doing treatment.

11. The method for manufacturing a semiconductor device according to claim 9, wherein the aluminum film is oxidized to be an aluminum oxide layer.

12. The method for manufacturing a semiconductor device according to claim 9, wherein the insulating layer comprises an oxygen excess region.

13. The method for manufacturing a semiconductor device according to claim 9, wherein the insulating layer comprises a layer containing nitrogen.

14. The method for manufacturing a semiconductor device according to claim 9, further comprising a step of performing heat treatment on the insulating layer before the aluminum film is formed.

15. The method for manufacturing a semiconductor device according to claim 9, wherein the gate insulating layer comprises an oxygen excess region.

16. The method for manufacturing a semiconductor device according to claim 15, wherein the oxygen excess region is formed by performing an oxygen doping treatment on the gate insulating layer.

* * * * *

UNITED STATES PATENT AND TRADEMARK OFFICE
CERTIFICATE OF CORRECTION

PATENT NO. : 8,785,258 B2
APPLICATION NO. : 13/711022
DATED : July 22, 2014
INVENTOR(S) : Shunpei Yamazaki It is certified that error appears in the above-identified patent and that said Letters Patent is hereby corrected as shown below:

In the Specification

Column 23, line 45, "OV," should be --0V,--.

Signed and Sealed this
Seventeenth Day of February, 2015

Michelle K. Lee
*Deputy Director of the United States Patent and Trademark Office*